United States Patent
Woods et al.

(10) Patent No.: US 7,383,844 B2
(45) Date of Patent: *Jun. 10, 2008

(54) MENISCUS, VACUUM, IPA VAPOR, DRYING MANIFOLD

(75) Inventors: Carl Woods, Aptos, CA (US); James P. Garcia, Santa Clara, CA (US); John de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/542,700

(22) Filed: Oct. 3, 2006

(65) Prior Publication Data
US 2007/0023070 A1 Feb. 1, 2007

Related U.S. Application Data

(60) Division of application No. 10/330,843, filed on Dec. 24, 2002, now Pat. No. 7,198,055, which is a continuation-in-part of application No. 10/261,839, filed on Sep. 30, 2002, now Pat. No. 7,234,477.

(51) Int. Cl.
B08B 3/00 (2006.01)

(52) U.S. Cl. .................. 134/95.2; 134/102.3; 134/172; 134/902

(58) Field of Classification Search .................. 134/26, 134/30, 34, 37, 95.1, 95.2, 99.1, 102.1, 102.3, 134/172, 902
See application file for complete search history.

(56) References Cited

U.S. PATENT DOCUMENTS 6,230,722 B1 * 5/2001 Mitsumori et al. ..... 134/122 R

* cited by examiner

Primary Examiner—Joseph L Perrin
(74) Attorney, Agent, or Firm—Martine Penilla & Gencarella, LLP

(57) ABSTRACT

A head is provided which includes a first surface of the head capable of being in close proximity to the wafer surface, and includes a first conduit region on the head where the first conduit region is defined for delivery of a first fluid to wafer of the surface and the first conduit region is defined in a center portion of the head. The head further includes a second conduit region on the head which surrounds the first conduit region, and includes a third conduit region on the head which is defined for delivery of a second fluid to the wafer surface. The third conduit region semi-encloses the first conduit region and the second conduit region. The second conduit region enables a removal of the first fluid and the second fluid. The delivery of the first fluid and the second fluid combined with the removal by the third conduit region of the head defines a controllable meniscus.

14 Claims, 35 Drawing Sheets

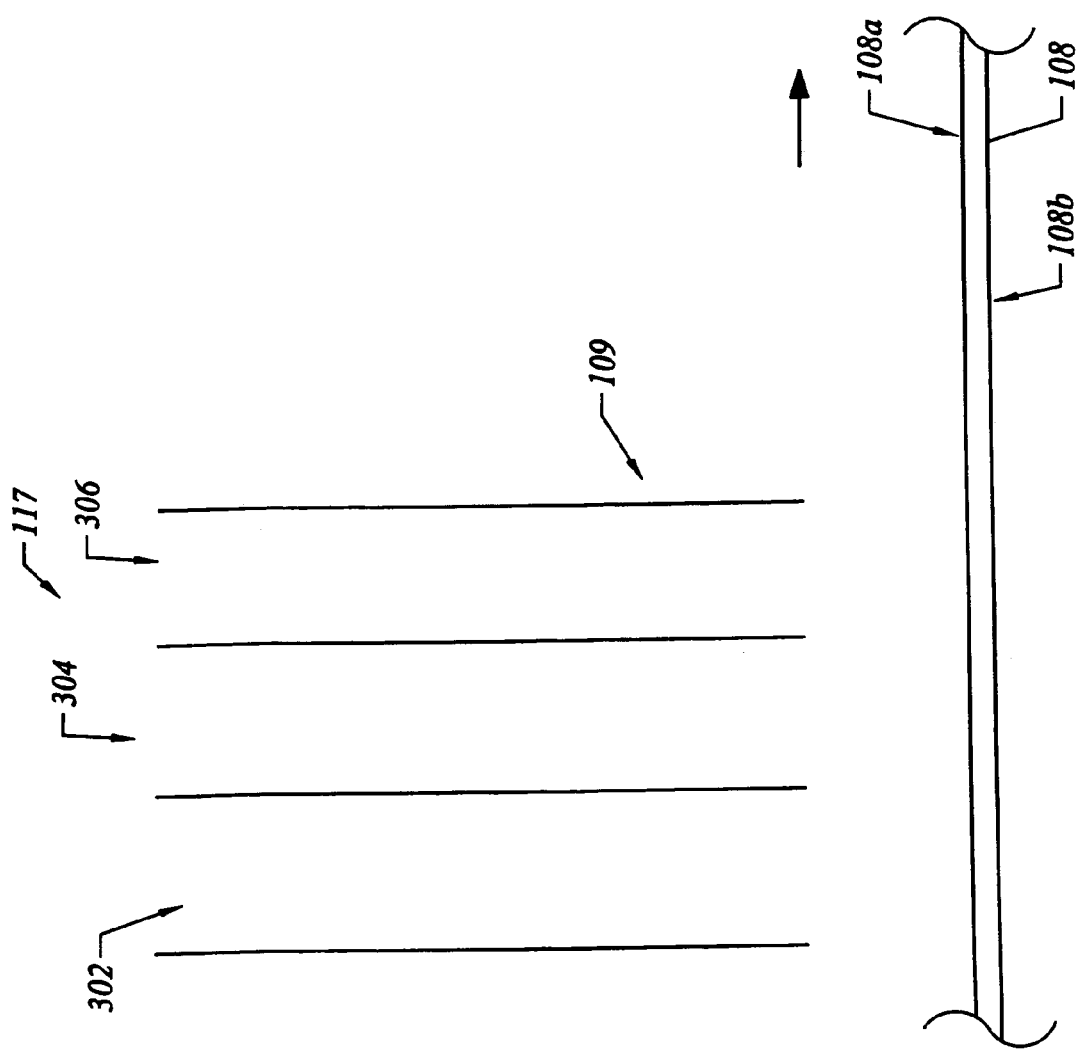

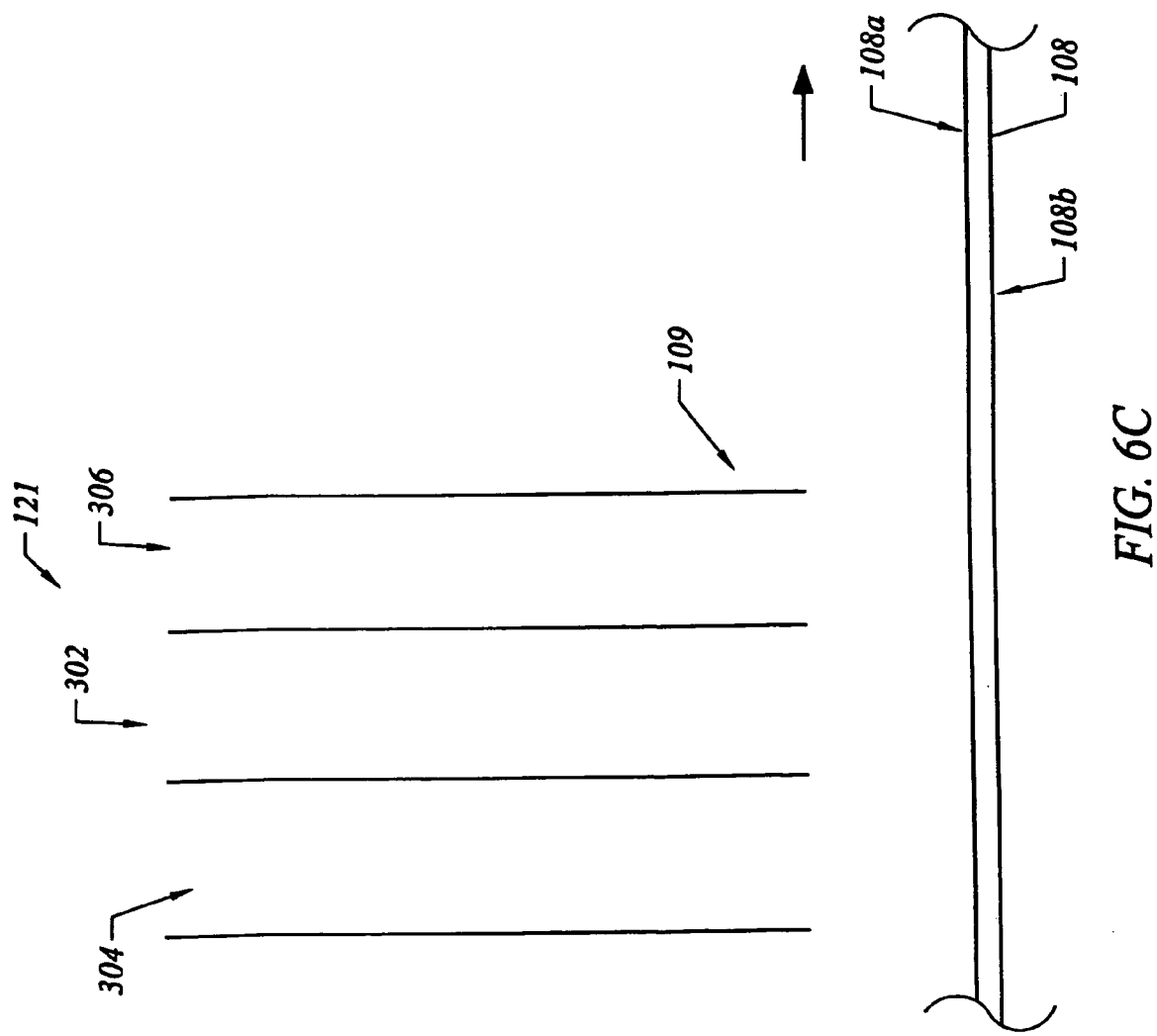

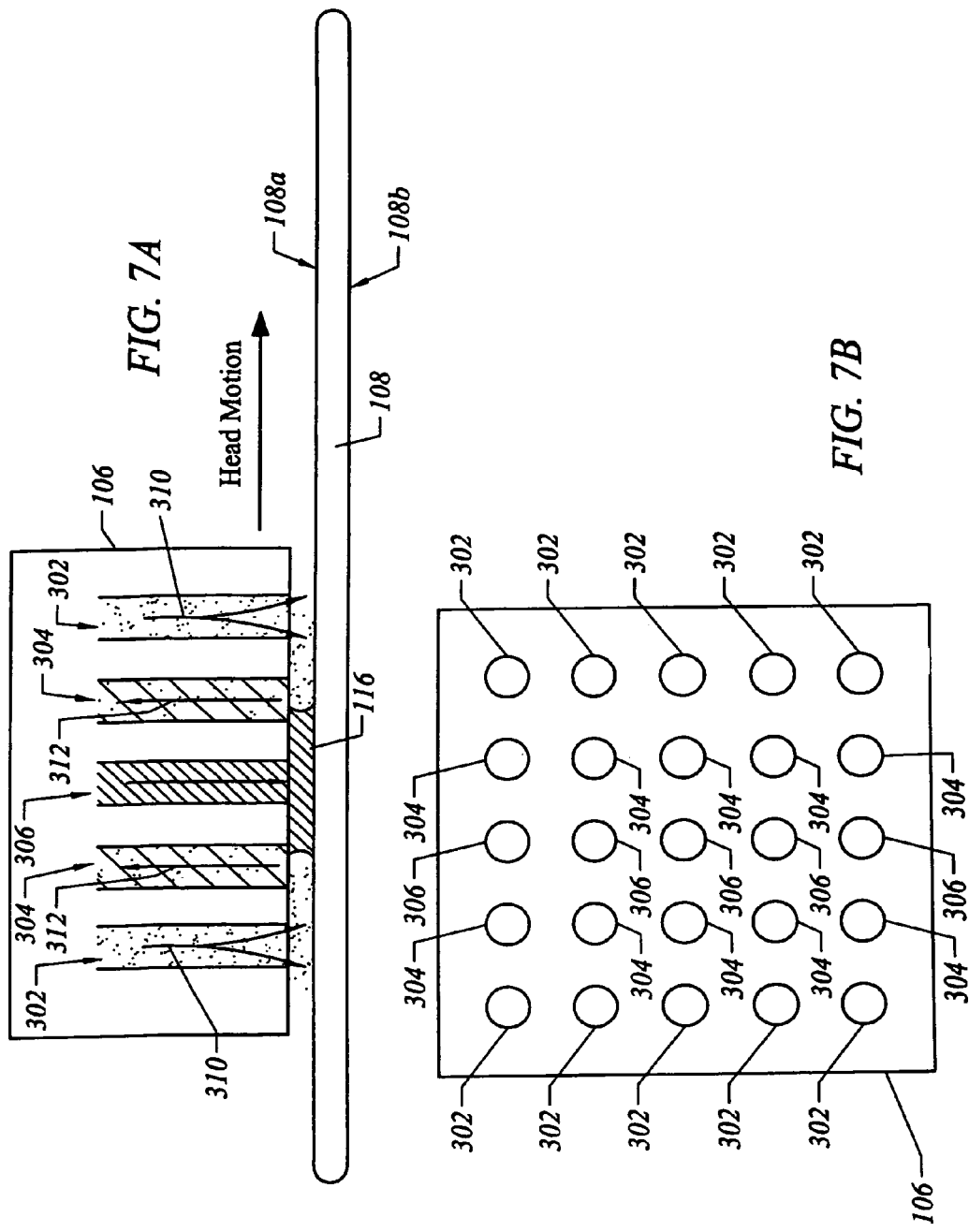

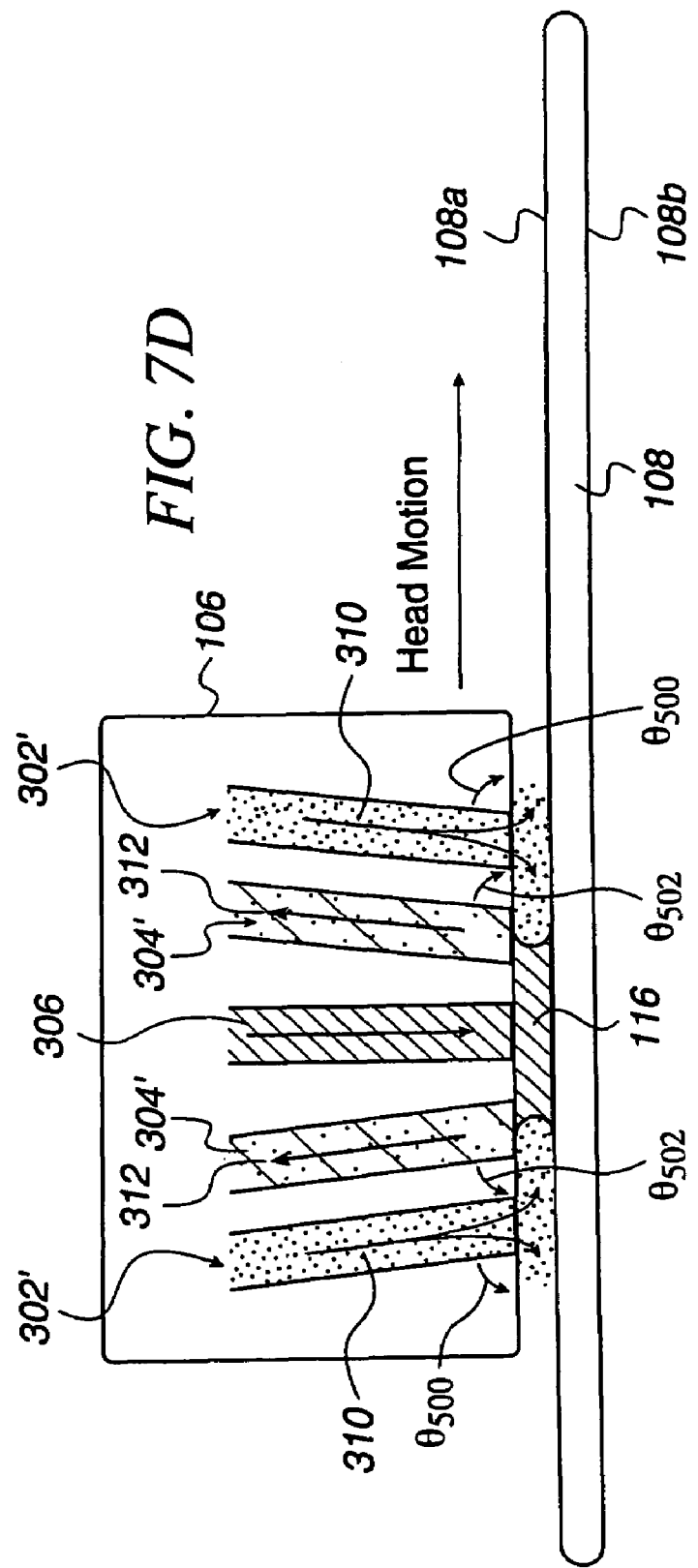

MENISCUS, VACUUM, IPA VAPOR, DRYING MANIFOLD

CROSS REFERENCE To RELATED APPLICATION

This application is a divisional application of U.S. patent application Ser. No. 10/330,843, filed on Dec. 24, 2002 now U.S. Pat. No. 7,198,055, and entitled, "Meniscus, Vacuum, IPA Vapor, Drying Manifold," which is a continuation-in-part of a U.S. patent application Ser. No. 10/261,839, from which priority under 35 U.S.C. § 120 is claimed, entitled "Method and Apparatus for Drying Semiconductor Wafer Surfaces Using a Plurality of Inlets and Outlets Held in Close Proximity to the Wafer Surfaces" filed on Sep. 30, 2002 now U.S. Pat. No. 7,234,477. The aforementioned patent application is hereby incorporated by reference. This application is related to U.S. patent application Ser. No. 10/330,897, filed on Dec. 24, 2002, entitled, "System for Substrate Processing with Meniscus, Vacuum, EPA vapor, Drying Manifold." The aforementioned patent application is hereby incorporated by reference.

BACKGROUND OF THE INVENTION

1. Field of the Invention

The present invention relates to semiconductor wafer cleaning and drying and, more particularly, to apparatuses and techniques for more efficiently removing fluids from wafer surfaces while reducing contamination and decreasing wafer cleaning cost.

2. Description of the Related Art

In the semiconductor chip fabrication process, it is well-known that there is a need to clean and dry a wafer where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder which pushes a wafer surface against a rolling conveyor belt. This conveyor belt uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form spots). To prevent evaporation from taking place, the cleaning fluid must be removed as quickly as possible without the formation of droplets on the wafer surface. In an attempt to accomplish this, one of several different drying techniques are employed such as spin drying, IPA, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface.

The most prevalent drying technique used today is spin rinse drying (SRD). FIG. 1 illustrates movement of cleaning fluids on a wafer 10 during an SRD drying process. In this drying process, a wet wafer is rotated at a high rate by rotation 14. In SRD, by use of centrifugal force, the water or cleaning fluid used to clean the wafer is pulled from the center of the wafer to the outside of the wafer and finally off of the wafer as shown by fluid directional arrows 16. As the cleaning fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1, the inside area of the circle formed by the moving liquid/gas interface 12 is free from the fluid and the outside area of the circle formed by the moving liquid/gas interface 12 is the cleaning fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the cleaning fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces.

Therefore, there is a need for a method and an apparatus that avoids the prior art by allowing quick and efficient cleaning and drying of a semiconductor wafer, but at the same time reducing the formation of numerous water or cleaning fluid droplets which may cause contamination to deposit on the wafer surface. Such deposits as often occurs today reduce the yield of acceptable wafers and increase the cost of manufacturing semiconductor wafers.

SUMMARY OF THE INVENTION

Broadly speaking, the present invention fills these needs by providing a cleaning and drying apparatus that is capable of removing fluids from wafer surfaces quickly while at the same time reducing wafer contamination. It should be appreciated that the present invention can be implemented in numerous ways, including as a process, an apparatus, a system, a device or a method. Several inventive embodiments of the present invention are described below.

In one embodiment, a substrate preparation system is provided which includes a head for use in preparing a wafer surface including a first surface of the head where the first surface capable of being placed in close proximity to the wafer surface. The head also includes a first conduit region on the head where the first conduit region is defined for delivery of a first fluid to wafer of the surface and the first conduit region is defined in a center portion of the head. The head further includes a second conduit region on the head where the second conduit region being configured to surround the first conduit region, and the head also includes a third conduit region on the head where the third conduit region is defined for delivery of a second fluid to the wafer surface, and the third conduit region defines a semi-enclosure of the first conduit region and the second conduit region. The second conduit region enables a removal of the first fluid and the second fluid, and wherein the delivery of the first fluid and the second fluid combined with the removal by the third conduit region of the head defines a controllable meniscus that is defined between the head and the wafer surface when in operation and the head is proximate to the wafer surface.

In another embodiment, a substrate preparation system is provided which includes a head having a head surface where the head surface is proximate to a surface of the substrate when in operation. The head also includes at least one of a first conduit for delivering a first fluid to the surface of the substrate through the head and at least one of a second conduit for delivering a second fluid to the surface of the substrate through the head where the second fluid being different than the first fluid. The head further includes at least one of a third conduit for removing each of the first fluid and the second fluid from the surface of the substrate where the at least one of the third conduit is located to substantially surround the at least one of the first conduit, wherein the at least one of the first conduit, the at least one of the second conduit, and the at least one of the third conduit act substantially simultaneously when in operation. The at least one of the second conduit is located to substantially surround at least a portion of the at least one of the third conduit.

In yet another embodiment, a method for preparing a wafer surface is provided that includes supplying a first fluid at a first region on the wafer surface, surrounding the first region with a vacuum region, and semi-enclosing the vacuum region with an applied surface tension reducing fluid region where the semi-enclosing defines an opening that leads to the vacuum region. The method also includes scanning the first region where the vacuum region and the applied surface tension reduces fluid region over the wafer surface where the scanning leads with the opening.

In another embodiment, a method for processing a substrate is provide that includes applying a first fluid onto a first region of a surface of a substrate, applying a second fluid onto a second region of the surface of the substrate, and removing the first fluid and the second fluid from the surface of the substrate where the removing occurring from a third region that substantially surrounds the first region. The second region substantially surrounds at least a portion of the third region, and the applying and the removing forms a controlled fluid meniscus The advantages of the present invention are numerous. Most notably, the apparatuses and methods described herein efficiently dry and clean a semiconductor wafer while reducing fluids and contaminants remaining on a wafer surface. Consequently, wafer processing and production may be increased and higher wafer yields may be achieved due to efficient wafer drying with lower levels of contamination. The present invention enables the improved drying and cleaning through the use of vacuum fluid removal in conjunction with fluid input. The pressures generated on a fluid film at the wafer surface by the aforementioned forces enable optimal removal of fluid at the wafer surface with a significant reduction in remaining contamination as compared with other cleaning and drying techniques. In addition, the present invention may utilize application of an isopropyl alcohol (IPA) vapor and deionized water towards a wafer surface along with generation of a vacuum near the wafer surface at substantially the same time. This enables both the generation and intelligent control of a meniscus and the reduction of water surface tension along a deionized water interface and therefore enables optimal removal of fluids from the wafer surface without leaving contaminants. The meniscus generated by input of IPA, DIW and output of fluids may be moved along the surface of the wafer to clean and dry the wafer. Therefore, the present invention evacuates fluid from wafer surfaces with extreme effectiveness while substantially reducing contaminant formation due to ineffective drying such as for example, spin drying.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 6A shows a proximity head inlet/outlet orientation that may be utilized to clean and dry the wafer in accordance with one embodiment of the present invention.

FIG. 6C shows a further proximity head inlet/outlet orientation that may be utilized to clean and dry the wafer in accordance with one embodiment of the present invention.

FIG. 7A illustrates a proximity head performing a drying operation in accordance with one embodiment of the present invention.

FIG. 7B shows a top view of a portion of a proximity head in accordance with one embodiment of the present invention.

FIG. 7D illustrates a proximity head with angled source inlets and angled source outlets performing a drying operation in accordance with one embodiment of the present invention.

DETAILED DESCRIPTION OF THE PREFERRED EMBODIMENTS

An invention for methods and apparatuses for cleaning and/or drying a wafer is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

FIGS. 2A through 2D below illustrate embodiments of an exemplary wafer processing system. It should be appreciated that the system is exemplary, and that any other suitable type of configuration that would enable movement of the proximity head(s) into close proximity to the wafer may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, etc. The motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In addition, the proximity head and the wafer cleaning and drying system described herein may be utilized to clean and dry any shape and size of substrates such as for example, 200 mm wafers, 300 mm wafers, flat panels, etc. The wafer cleaning and drying system may be utilized for either or both cleaning and drying the wafer depending on the configuration of the system.

Figure 1:
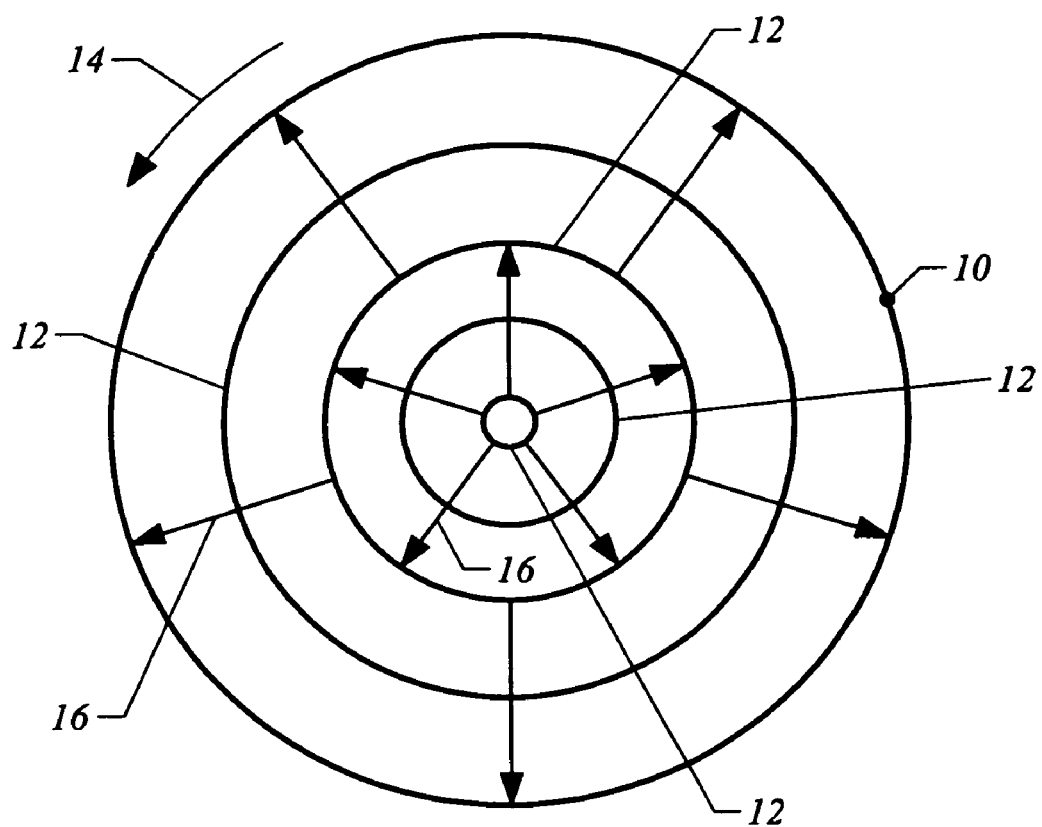
FIG. 1 illustrates movement of cleaning fluids on a wafer during an SRD drying process.
Figure 2A:
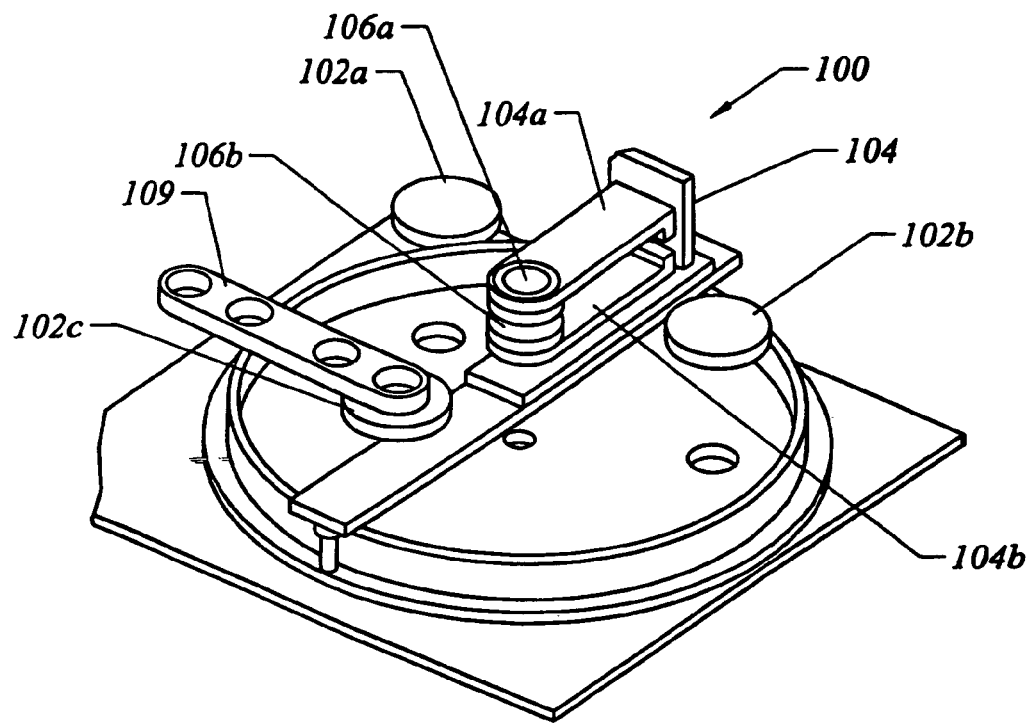
FIG. 2A shows a wafer cleaning and drying system in accordance with one embodiment of the present invention.

FIG. 2A shows a wafer cleaning and drying system 100 in accordance with one embodiment of the present invention. The system 100 includes rollers 102a, 102b, and 102c which may hold and rotate a wafer to enable wafer surfaces to be dried. The system 100 also includes proximity heads 106a and 106b that, in one embodiment, are attached to an upper arm 104a and to a lower arm 104b respectively. The upper arm 104a and the lower arm 104b are part of a proximity head carrier assembly 104 which enables substantially linear movement of the proximity heads 106a and 106b along a radius of the wafer.

In one embodiment the proximity head carrier assembly 104 is configured to hold the proximity head 106a above the wafer and the proximity head 106b below the wafer in close proximity to the wafer. This may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. The upper arm 104a and the lower arm 104b may be configured in any suitable way so the proximity heads 106a and 106b can be moved to enable wafer processing as described herein. It should be appreciated that the system 100 may be configured in any suitable manner as long as the proximity head(s) may be moved in close proximity to the wafer to generate and control a meniscus as discussed below in reference to FIGS. 6D through 8B. It should also be understood that close proximity may be any suitable distance from the wafer as long as a meniscus as discussed in further reference to FIG. 6D through 8B may be maintained. In one embodiment, the proximity heads 106a and 106b (as well as any other proximity head described herein) may each be moved to between about 0.1 mm to about 10 mm from the wafer to initiate wafer processing operations. In a preferable embodiment, the proximity heads 106a and 106b (as well as any other proximity head described herein) may each be moved to between about 0.5 mm to about 4.5 mm from the wafer to initiate wafer processing operations, and in more preferable embodiment, the proximity heads 106a and 106b (as well as any other proximity head described herein) may be moved to about 2 mm from the wafer to initiate wafer processing operations.

Figure 2B:
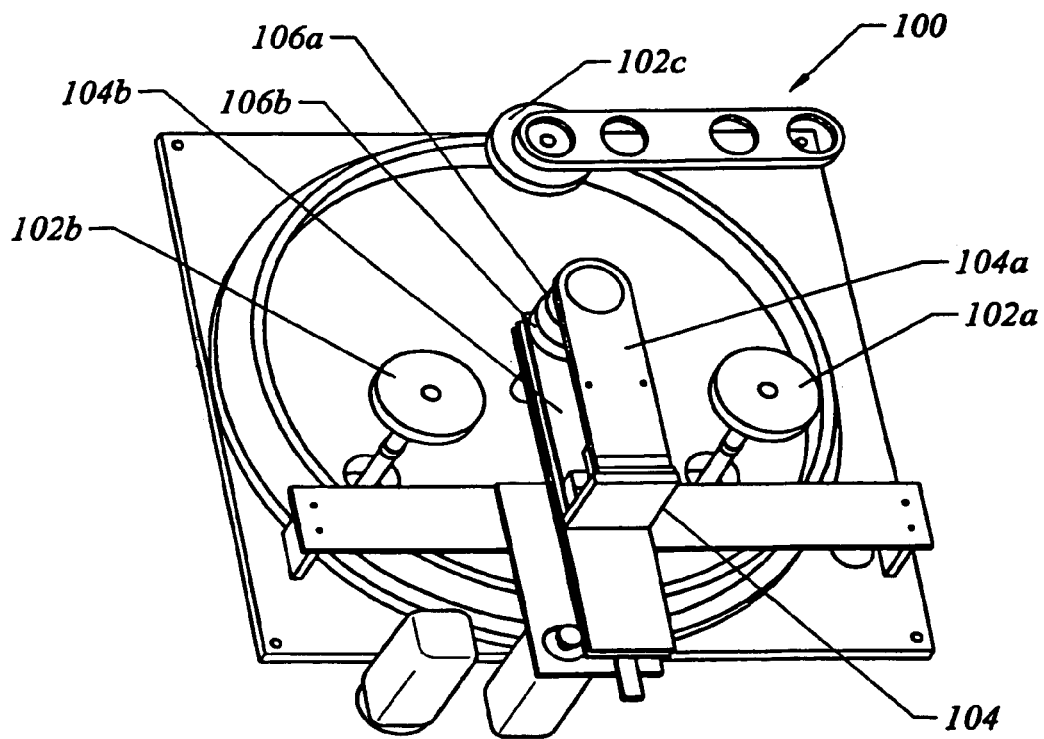
FIG. 2B shows an alternate view of the wafer cleaning and drying system in accordance with one embodiment of present invention.

FIG. 2B shows an alternate view of the wafer cleaning and drying system 100 in accordance with one embodiment of present invention. The system 100, in one embodiment, has the proximity head carrier assembly 104 that is configured to enable the proximity heads 106a and 106b to be moved from the center of the wafer towards the edge of the wafer. It should be appreciated that the proximity head carrier assembly 104 may be movable in any suitable manner that would enable movement of the proximity heads 106a and 106b to clean and/or dry the wafer as desired. In one embodiment, the proximity head carrier assembly 104 can be motorized to move the proximity head 106a and 106b from the center of the wafer to the edge of the wafer. It should be understood that although the wafer cleaning and drying system 100 is shown with the proximity heads 106a and 106b, that any suitable number of proximity heads may be utilized such as, for example, 1, 2, 3, 4, 5, 6, etc. The proximity heads 106a and/or 106b of the wafer cleaning and drying system 100 may also be any suitable size or shape as shown by, for example, any of the proximity heads as described herein. The different configurations described herein generate a fluid meniscus between the proximity head and the wafer. The fluid meniscus may be moved across the wafer to clean and dry the wafer by applying fluid to the wafer surface and removing the fluids from the surface. Therefore, the proximity heads 106a and 106b can have any numerous types of configurations as shown herein or other configurations that enable the processes described herein. It should also be appreciated that the system 100 may clean and dry one surface of the wafer or both the top surface and the bottom surface of the wafer.

In addition, besides cleaning or drying both the top and bottom surfaces and of the wafer, the system 100 may also be configured to clean one side of the wafer and dry another side of the wafer if desired by inputting and outputting different types of fluids. It should be appreciated that the system 100 may utilize the application of different chemicals top and bottom in the proximity heads 106a and 106b respectively depending on the operation desired. The proximity heads can be configured to clean and dry the bevel edge of the wafer in addition to cleaning and/or drying the top and/or bottom of the wafer. This can be accomplished by moving the meniscus off the edge the wafer which cleans the bevel edge. It should also be understood that the proximity heads 106a and 106b may be the same type of apparatus or different types of proximity heads.

Figure 2C:
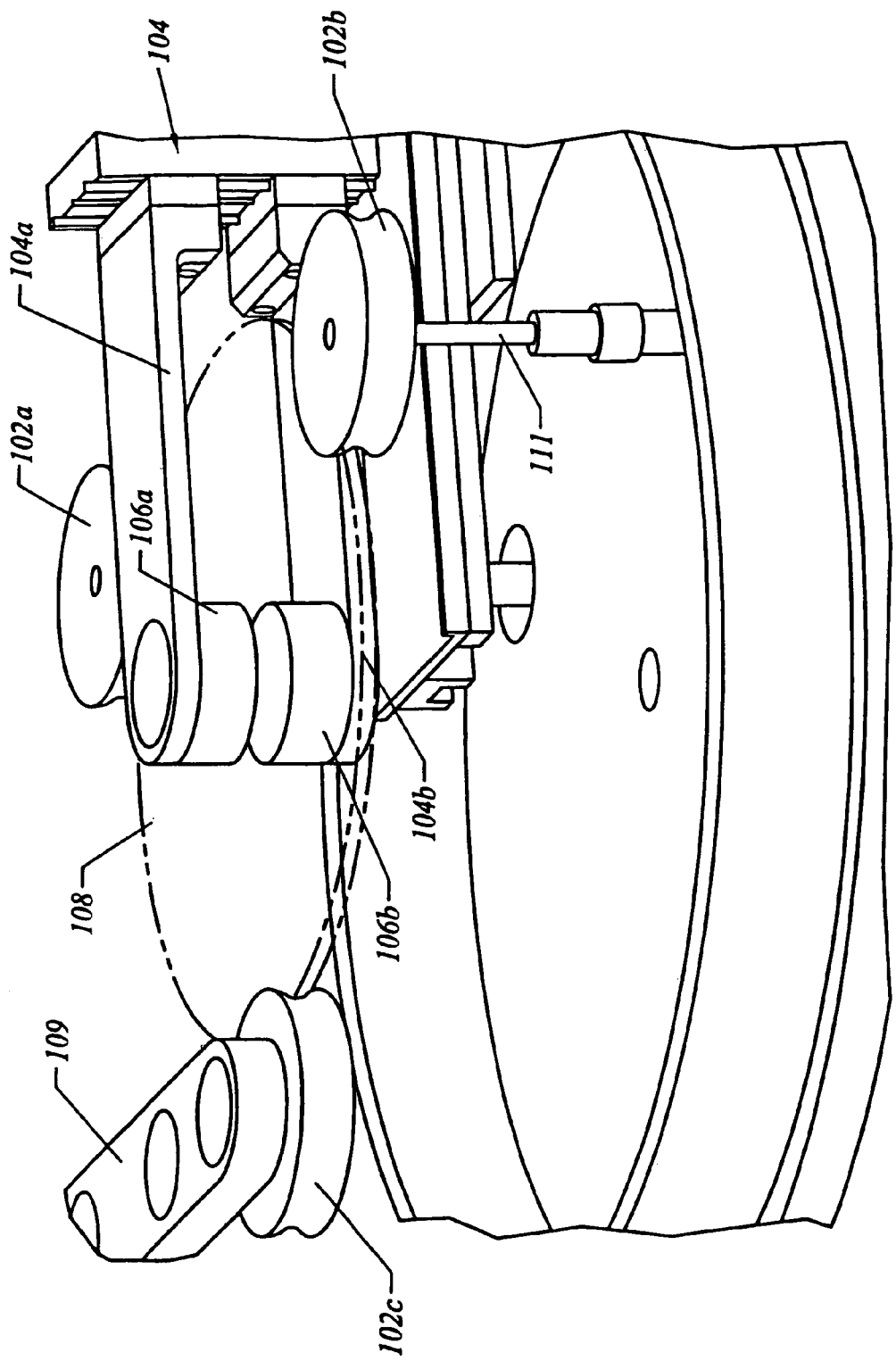
FIG. 2C illustrates a side close-up view of the wafer cleaning and drying system holding a wafer in accordance with one embodiment of the present invention.

FIG. 2C illustrates a side close-up view of the wafer cleaning and drying system 100 holding a wafer 108 in accordance with one embodiment of the present invention. The wafer 108 may be held and rotated by the rollers 102a, 102b, and 102c in any suitable orientation as long as the orientation enables a desired proximity head to be in close proximity to a portion of the wafer 108 that is to be cleaned or dried. In one embodiment, the roller 102b may be rotated by using a spindle 111, and the roller 102c may held and rotated by a roller arm 109. The roller 102a may also be rotated by its own spindle (as shown in FIG. 3B. In one embodiment, the rollers 102a, 102b, and 102c can rotate in a clockwise direction to rotate the wafer 108 in a counter-clockwise direction. It should be understood that the rollers may be rotated in either a clockwise or a counterclockwise direction depending on the wafer rotation desired. In one embodiment, the rotation imparted on the wafer 108 by the rollers 102a, 102b, and 102c serves to move a wafer area that has not been processed into close proximity to the proximity heads 106a and 106b. However, the rotation itself does not dry the wafer or move fluid on the wafer surfaces towards the edge of the wafer. Therefore, in an exemplary drying operation, the wet areas of the wafer would be presented to the proximity heads 106a and 106b through both the linear motion of the proximity heads 106a and 106b and through the rotation of the wafer 108. The drying or cleaning operation itself is conducted by at least one of the proximity heads. Consequently, in one embodiment, a dry area of the wafer 108 would expand from a center region to the edge region of the wafer 108 in a spiral movement as a drying operation progresses. In a preferable embodiment, the dry are of the wafer 108 would move around the wafer 108 and the wafer 108 would be dry in one rotation (if the length of the proximity heads 106a and 106b are at least a radius of the wafer 108) By changing the configuration of the system 100 and the orientation of and movement of the proximity head 106a and/or the proximity head 106b, the drying movement may be changed to accommodate nearly any suitable type of drying path.

It should be understood that the proximity heads 106a and 106b may be configured to have at least one of first source inlet configured to input deionized water (DIW) (also known as a DIW inlet), at least one of a second source inlet configured to input isopropyl alcohol (IPA) in vapor form (also known as IPA inlet), and at least one source outlet configured to output fluids from a region between the wafer and a particular proximity head by applying vacuum (also known as vacuum outlet). It should be appreciated that the vacuum utilized herein may also be suction. In addition, other types of solutions may be inputted into the first source inlet and the second source inlet such as, for example, cleaning solutions, ammonia, HF, etc. It should be appreciated that although IPA vapor is used in some of the exemplary embodiments, any other type of vapor may be utilized such as for example, nitrogen, any suitable alcohol vapor, organic compounds, etc. that may be miscible with water.

In one embodiment, the at least one IPA vapor inlet is adjacent to the at least one vacuum outlet which is in turn adjacent to the at least one DIW inlet to form an IPA-vacuum-DIW orientation. It should be appreciated that other types of orientations such as IPA-DIW-vacuum, DIW-vacuum-IPA, vacuum-IPA-DIW, etc. may be utilized depending on the wafer processes desired and what type of wafer cleaning and drying mechanism is sought to be enhanced. In a preferable embodiment, the IPA-vacuum-DIW orientation may be utilized to intelligently and powerfully generate, control, and move the meniscus located between a proximity head and a wafer to clean and dry wafers. The DIW inlets, the IPA vapor inlets, and the vacuum outlets may be arranged in any suitable manner if the above orientation is maintained. For example, in addition to the IPA vapor inlet, the vacuum outlet, and the DIW inlet, in an additional embodiment, there may be additional sets of IPA vapor outlets, DIW inlets and/or vacuum outlets depending on the configuration of the proximity head desired. Therefore, another embodiment may utilize an EPA-vacuum-DIW-DIW-vacuum-IPA or other exemplary embodiments with an IPA source inlet, vacuum source outlet, and DIW source inlet configurations are described herein with a preferable embodiment being described in reference to FIG. 6D. It should be appreciated that the exact configuration of the IPA-vacuum-DIW orientation may be varied depending on the application. For example, the distance between the IPA input, vacuum, and DIW input locations may be varied so the distances are consistent or so the distances are inconsistent. In addition, the distances between the IPA input, vacuum, and DIW output may differ in magnitude depending on the size, shape, and configuration of the proximity head 106a and the desired size of a process window as described in further detail in reference to FIG. 10. In addition, as discussed in reference to FIG. 10, the IPA-vacuum-DIW orientation is configured so a vacuum region substantially surrounds a DIW region and the IPA region substantially surrounds at least the trailing edge region of the vacuum region.

Figure 2D:
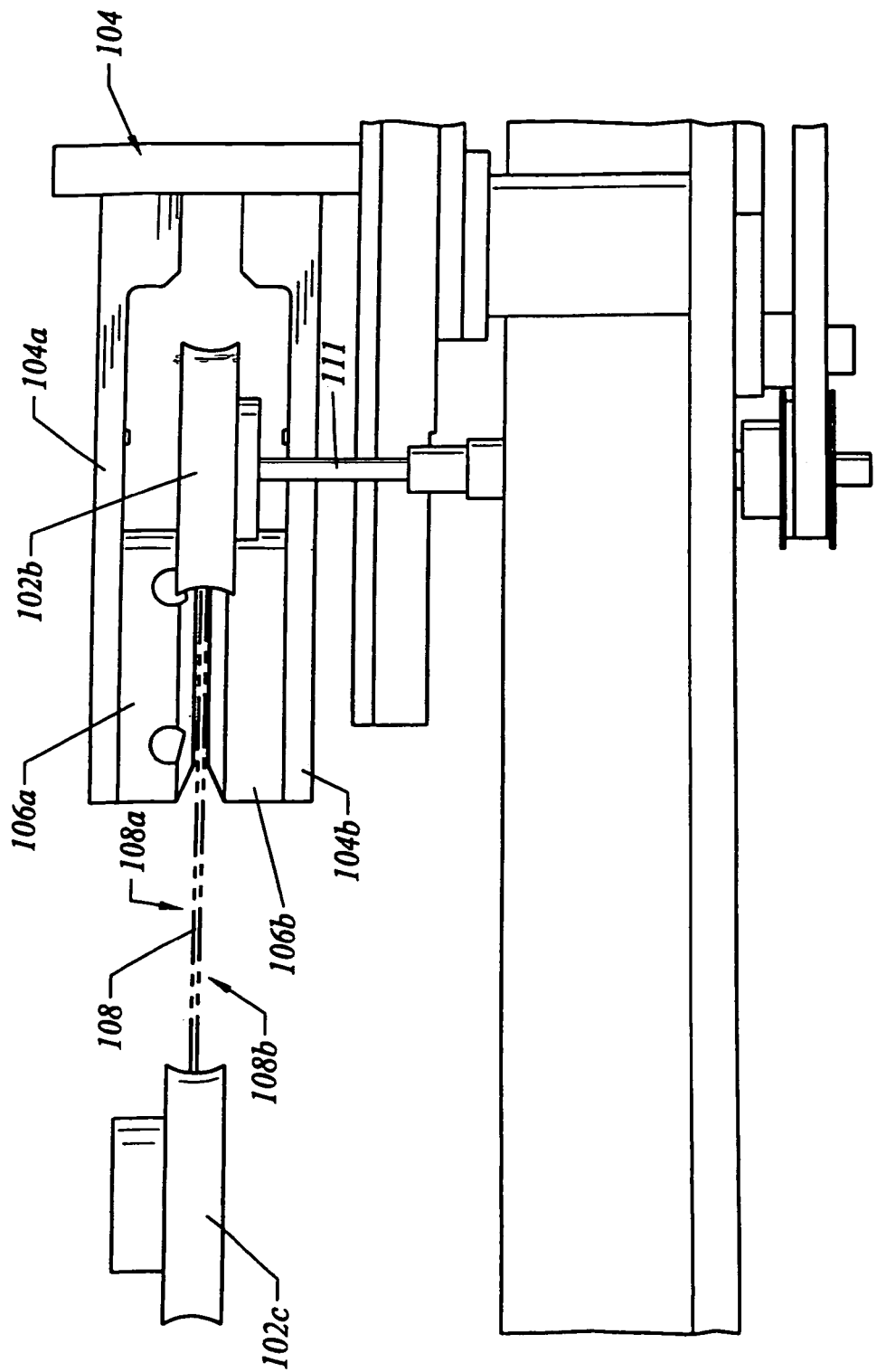
FIG. 2D shows another side close-up view of the wafer cleaning and drying system in accordance with one embodiment of the present invention.

FIG. 2D shows another side close-up view of the wafer cleaning and drying system 100 in accordance with one embodiment of the present invention. In this embodiment, the proximity heads 106a and 106b have been positioned in close proximity to a top surface 108a and a bottom surface 108b of the wafer 108 respectively by utilization of the proximity head carrier assembly 104. Once in this position, the proximity heads 106a and 106b may utilize the IPA and DIW source inlets and a vacuum source outlet(s) to generate wafer processing meniscuses in contact with the wafer 108 which are capable of removing fluids from a top surface 108a and a bottom surface 108b. The wafer processing meniscus may be generated in accordance with the descriptions in reference to FIGS. 6 through 9B where IPA vapor and DIW are inputted into the region between the wafer 108 and the proximity heads 106a and 106b. At substantially the same time the IPA and DIW is inputted, a vacuum may be applied in close proximity to the wafer surface to output the IPA vapor, the DIW, and the fluids that may be on a wafer surface. It should be appreciated that although IPA is utilized in the exemplary embodiment, any other suitable type of vapor may be utilized such as for example, nitrogen, any suitable alcohol vapor, organic compounds, hexanol, ethyl glycol, etc. that may be miscible with water. These fluids may also be known as surface tension reducing fluids. The portion of the DIW that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

In another exemplary embodiment, the proximity heads 106a and 106b may be moved in a manner so all parts of the wafer 108 are cleaned, dried, or both without the wafer 108 being rotated. In such an embodiment, the proximity head carrier assembly 104 may be configured to enable movement of the either one or both of the proximity heads 106a and 106b to close proximity of any suitable region of the wafer 108. In one embodiment, of the proximity heads are smaller in length than a radius of the wafer, the proximity heads may be configured to move in a spiral manner from the center to the edge of the wafer 108 or vice versa. In a preferable embodiment, when the proximity heads are larger in length than a radius of the wafer, the proximity heads 106a and 106b may be moved over the entire surface of the wafer in one rotation. In another embodiment, the proximity heads 104a and 104b may be configured to move in a linear fashion back and forth across the wafer 108 so all parts of the wafer surfaces 108a and/or 108b may be processed. In yet another embodiment, configurations as discussed below in reference to FIG. 5C through 5H may be utilized. Consequently, countless different configurations of the system 100 may be utilized in order to obtain an optimization of the wafer processing operation.

Figure 3A:
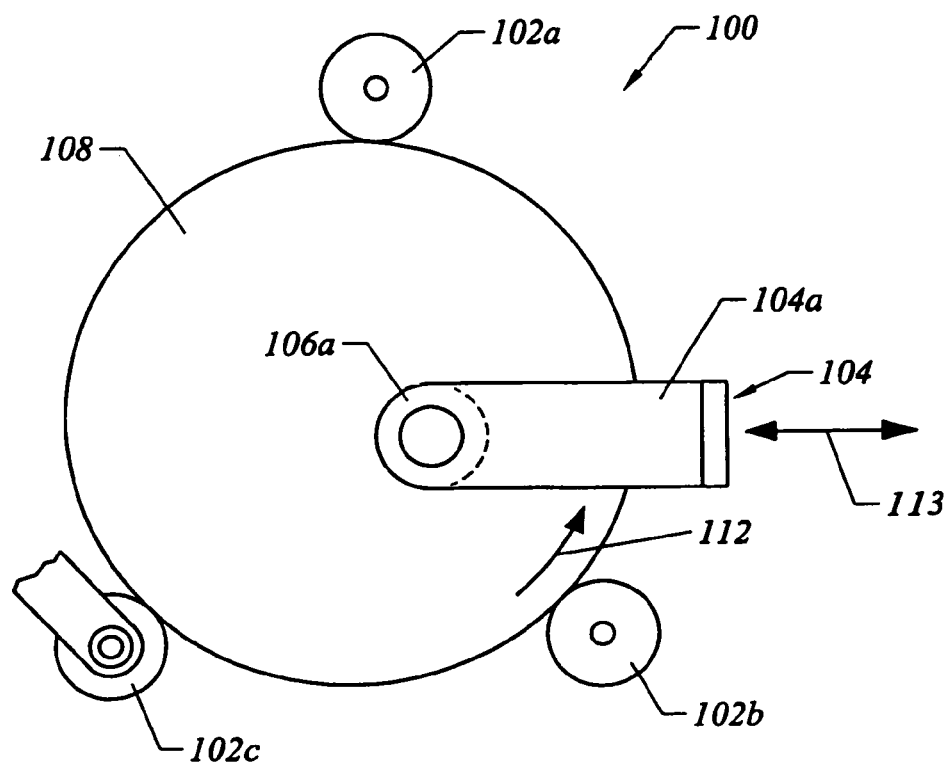
FIG. 3A shows a top view illustrating the wafer cleaning and drying system with dual proximity heads in accordance with one embodiment of the present invention.
Figure 3B:
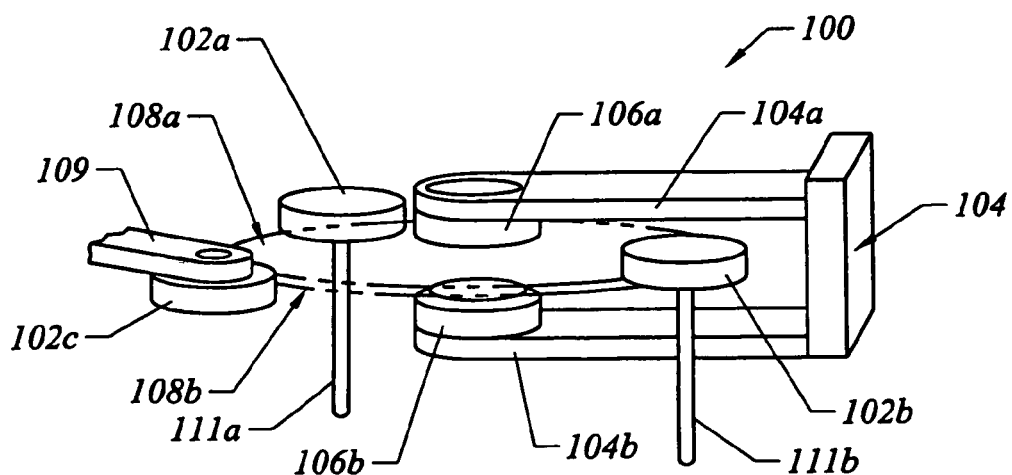
FIG. 3B illustrates a side view of the wafer cleaning and drying system with dual proximity heads in accordance with one embodiment of the present invention.

FIG. 3A shows a top view illustrating the wafer cleaning and drying system 100 with dual proximity heads in accordance with one embodiment of the present invention. As described above in reference to FIGS. 2A to 2D, the upper arm 104a may be configured to move and hold the proximity head 106a in a position in close proximity over the wafer 108. The upper arm 104a may also be configured to move the proximity head 106a from a center portion of the wafer 108 towards the edge of the wafer 108 in a substantially linear fashion 113. Consequently, in one embodiment, as the wafer 108 moves as shown by rotation 112, the proximity head 106a is capable of removing a fluid film from the top surface 108a of the wafer 108 using a process described in further detail in reference to FIGS. 6 through 8. Therefore, the proximity head 106a may dry the wafer 108 in a substantially spiral path over the wafer 108. In another embodiment as shown in reference to FIG. 3B, there may be a second proximity head located below the wafer 108 to remove a fluid film from the bottom surface 108b of the wafer 108.

FIG. 3B illustrates a side view of the wafer cleaning and drying system 100 with dual proximity heads in accordance with one embodiment of the present invention. In this embodiment, the system 100 includes both the proximity head 106a capable of processing a top surface of the wafer 108 and the proximity head 106b capable of processing a bottom surface of the wafer 108. In one embodiment, spindles 111a and 111b along with a roller arm 109 may rotate the rollers 102a, 102b, and 102c respectively. This rotation of the rollers 102a, 102b, and 102c may rotate the wafer 108 so substantially all surfaces of the wafer 108 may be presented to the proximity heads 106a and 106b for drying and/or cleaning. In one embodiment, while the wafer 108 is being rotated, the proximity heads 106a and 106b are brought to close proximity of the wafer surfaces 108a and 108b by the arms 104a and 104b respectively. Once the proximity heads 106a and 106b are brought into close proximity to the wafer 108, the wafer drying or cleaning may be begun. In operation, the proximity heads 106a and 106b may each remove fluids from the wafer 108 by applying IPA, deionized water and vacuum to the top surface and the bottom surface of the wafer 108 as described in reference to FIG. 6.

In one embodiment, by using the proximity heads 106a and 106b, the system 100 may dry a 200 mm wafer in less than 45 seconds. In another embodiment, where the proximity heads 106a and 106b are at least a radius of the wafer in length, the drying time for a wafer may be less than 30 seconds. It should be understood that drying or cleaning time may be decreased by increasing the speed at which the proximity heads 106a and 106b travels from the center of the wafer 108 to the edge of the wafer 108. In another embodiment, the proximity heads 106a and 106b may be utilized with a faster wafer rotation to dry the wafer 108 in less time. In yet another embodiment, the rotation of the wafer 108 and the movement of the proximity heads 106a and 106b may be adjusted in conjunction to obtain an optimal drying/cleaning speed. In one embodiment, the proximity heads 106a and 106b may move linearly from a center region of the wafer 108 to the edge of the wafer 108 at between about 0 mm per second to about 50 mm per second.

Figure 4A:
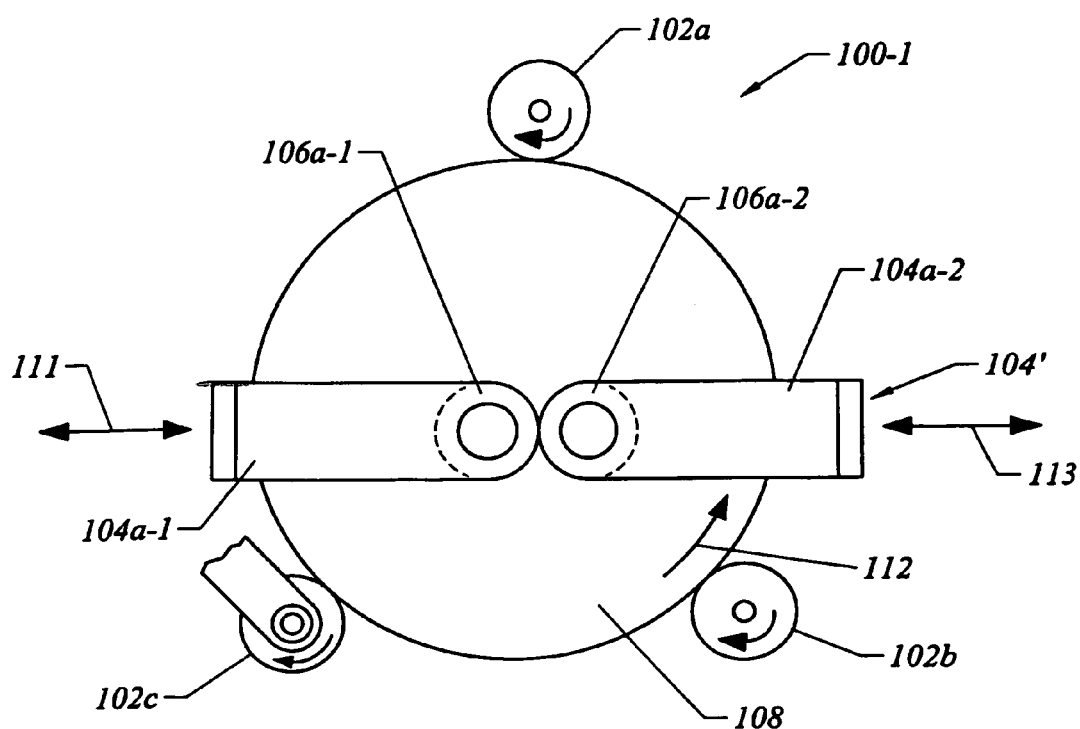
FIG. 4A shows a top view of a wafer cleaning and drying system which includes multiple proximity heads for a particular surface of the wafer in accordance with one embodiment of the present invention.
Figure 4B:
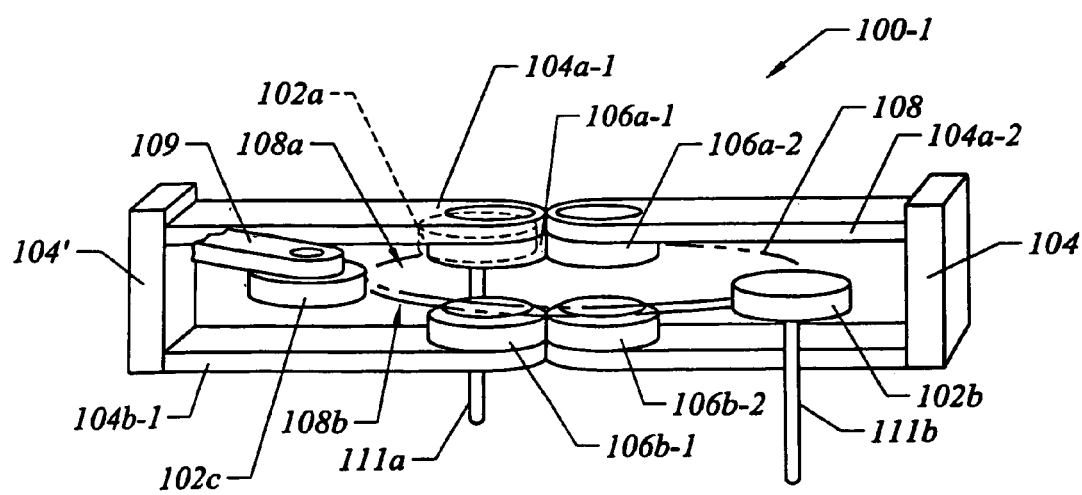
FIG. 4B shows a side view of the wafer cleaning and drying system which includes multiple proximity heads for a particular surface of the wafer in accordance with one embodiment of the present invention.

FIG. 4A shows a top view of a wafer cleaning and drying system 100-1 which includes multiple proximity heads for a particular surface of the wafer 108 in accordance with one embodiment of the present invention. In this embodiment, the system 100-1 includes an upper arm 104a-1 and an upper arm 104a-2. As shown in FIG. 4B, the system 100-1 also may include lower arm 104b-1 and lower arm 104b-2 connected to proximity heads 106b-1 and 106b-2 respectively. In the system 100-1, the proximity heads 106a-1 and 106a-2 (as well as 106b-1 and 106b-2 if top and bottom surface processing is being conducted) work in conjunction so, by having two proximity heads processing a particular surface of the wafer 108, drying time or cleaning time may be cut to about half of the time. Therefore, in operation, while the wafer 108 is rotated, the proximity heads 106a-1, 106a-2, 106b-1, and 106b-2 start processing the wafer 108 near the center of the wafer 108 and move outward toward the edge of the wafer 108 in a substantially linear fashion. In this way, as the rotation 112 of the wafer 108 brings all regions of the wafer 108 in proximity with the proximity heads so as to process all parts of the wafer 108. Therefore, with the linear movement of the proximity heads 106a-1, 106a-2, 106b-1, and 106b-2 and the rotational movement of the wafer 108, the wafer surface being dried moves in a spiral fashion from the center of the wafer 108 to the edge of the wafer 108.

In another embodiment, the proximity heads 106a-1 and 106b-1 may start processing the wafer 108 and after they have moved away from the center region of the wafer 108, the proximity heads 106a-2 and 106b-2 may be moved into place in the center region of the wafer 108 to augment in wafer processing operations. Therefore, the wafer processing time may be decreased significantly by using multiple proximity heads to process a particular wafer surface.

FIG. 4B shows a side view of the wafer cleaning and drying system 100-1 which includes multiple proximity heads for a particular surface of the wafer 108 in accordance with one embodiment of the present invention. In this embodiment, the system 100-1 includes both the proximity heads 106a-1 and 106a-2 that are capable of processing the top surface 108a of the wafer 108, and proximity heads 106b-1 and 106b-2 capable of processing the bottom surface 108b of the wafer 108. As in the system 100, the spindles 111a and 111b along with a roller arm 109 may rotate the rollers 102a, 102b, and 102c respectively. This rotation of the rollers 102a, 102b, and 102c may rotate the wafer 108 so substantially all surfaces of the wafer 108 may brought in close proximity to the proximity heads 106a-1, 106a-2, 106b-1, and 106b-2 for wafer processing operations.

In operation, each of the proximity heads 106a-1, 106a-2, 106b-1, and 106b-2 may remove fluids from the wafer 108 by applying IPA, deionized water and vacuum to the top surface and the bottom surface of the wafer 108 as shown, for example, in FIG. 6 through 8. By having two proximity heads per wafer side, the wafer processing operation (i.e., cleaning and/or drying) may be accomplished in substantially less time. It should be appreciated that as with the wafer processing system described in reference to FIGS. 3A and 3B, the speed of the wafer rotation may be varied to any suitable speed as long as the configuration enables proper wafer processing. In one embodiment, the wafer processing time may be decreased when half a rotation of the wafer 108 is used to dry the entire wafer. In such an embodiment, the wafer processing speed may be about half of the processing speed when only one proximity head is utilized per wafer side.

Figure 5A:
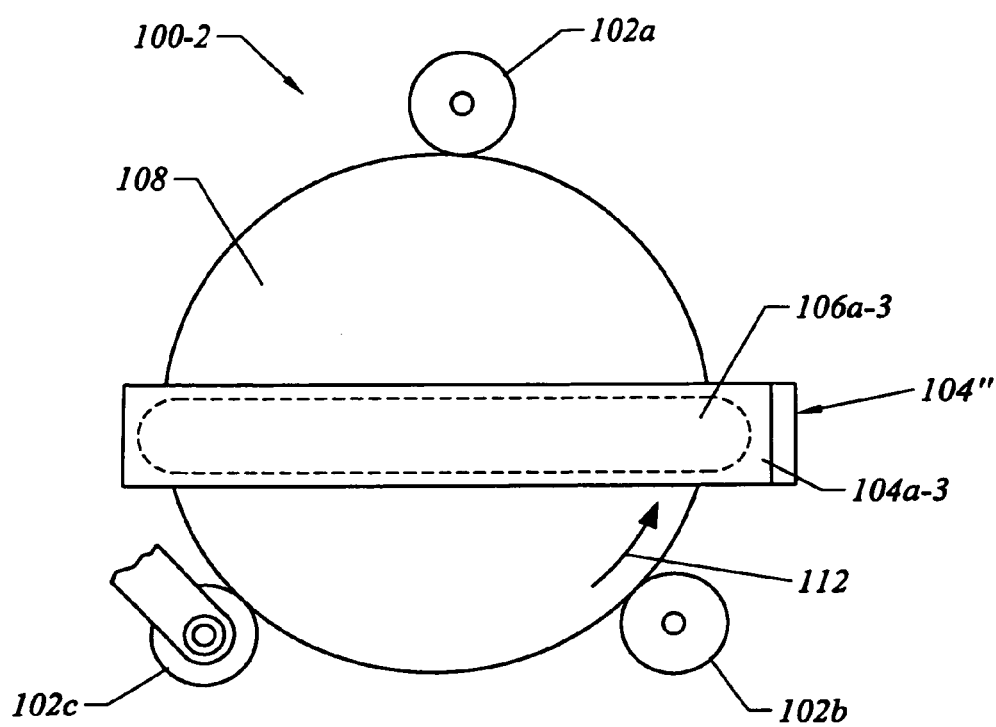
FIG. 5A shows a top view of a wafer cleaning and drying system with a proximity head in a horizontal configuration which extends across a diameter of the wafer 108 in accordance with one embodiment of the present invention.

FIG. 5A shows a top view of a wafer cleaning and drying system 100-2 with a proximity head 106a-3 in a horizontal configuration which extends across a diameter of the wafer 108 in accordance with one embodiment of the present invention. In this embodiment, the proximity head 106a-3 is held by an upper arm 104a-3 that extends across a diameter of the wafer 108. In this embodiment, the proximity head 106a-3 may be moved into a cleaning/drying position by a vertical movement of the upper arm 104a-3 so the proximity head 106a-3 can be in a position that is in close proximity to the wafer 108. Once the proximity head 106a-3 is in close proximity to the wafer 108, the wafer processing operation of a top surface of the wafer 108 can take place.

Figure 5B:
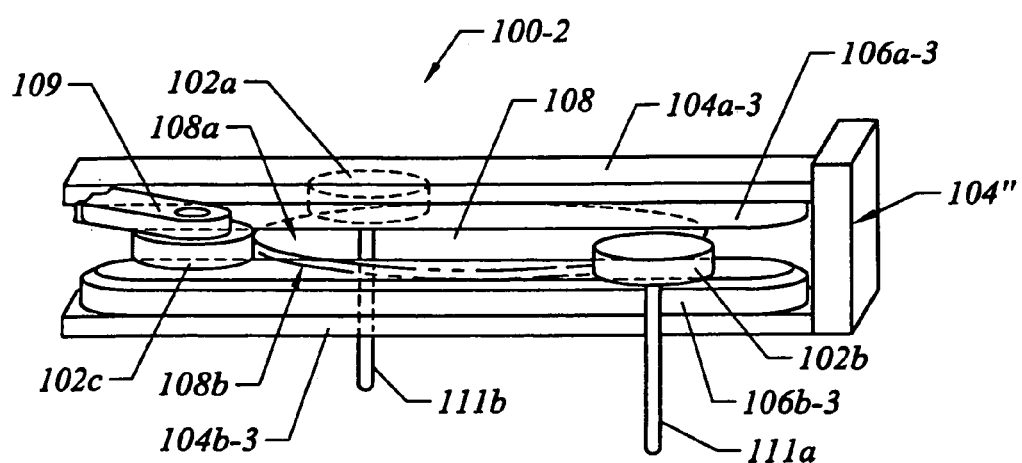
FIG. 5B shows a side view of a wafer cleaning and drying system with the proximity heads in a horizontal configuration which extends across a diameter of the wafer in accordance with one embodiment of the present invention.

FIG. 5B shows a side view of a wafer cleaning and drying system 100-2 with the proximity heads 106a-3 and 106b-3 in a horizontal configuration which extends across a diameter of the wafer 108 in accordance with one embodiment of the present invention. In this embodiment, the proximity head 106a-3 and the proximity head 106b-3 both are elongated to be able to span the diameter of the wafer 108. In one embodiment, while the wafer 108 is being rotated, the proximity heads 106a-3 and 106b-3 are brought to close proximity of the wafer surfaces 108a and 108b by the top arm 104a and a bottom arm 106b-3 respectively. Because the proximity heads 106a-3 and 106b-3 extend across the wafer 108, only half of a full rotation may be needed to clean/dry the wafer 108.

Figure 5C:
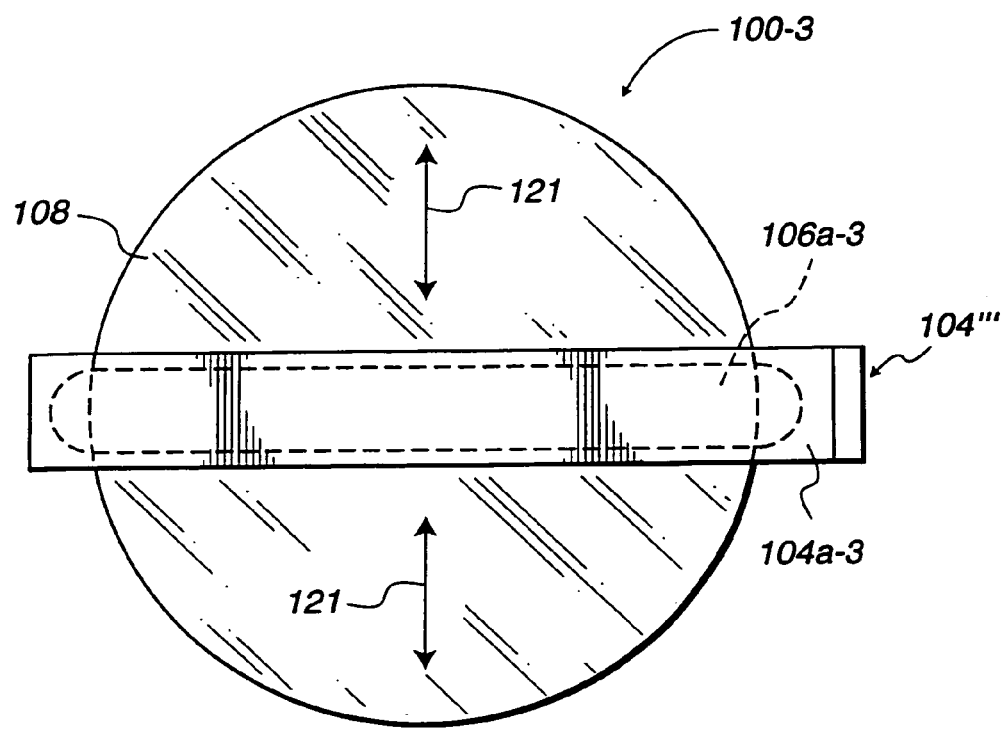
FIG. 5C shows a top view of a wafer cleaning and drying system with the proximity heads in a horizontal configuration which is configured to clean and/or dry the wafer that is stationary in accordance with one embodiment of the present invention.

FIG. 5C shows a top view of a wafer cleaning and drying system 100-3 with the proximity heads 106a-3 and 106b-3 in a horizontal configuration which is configured to clean and/or dry the wafer 108 that is stationary in accordance with one embodiment of the present invention. In this embodiment, the wafer 108 may be held stationary by any suitable type of wafer holding device such as, for example, an edge grip, fingers with edge attachments, etc. The proximity head carrier assembly 104''' is configured to be movable from one edge of the wafer 108 across the diameter of the wafer 108 to an edge on the other side of the wafer 108 after crossing the entire wafer diameter. In this fashion, the proximity head 106a-3 and/or the proximity head 106b-3 (as shown below in reference to FIG. 5D) may move across the wafer following a path along a diameter of the wafer 108 from one edge to an opposite edge. It should be appreciated that the proximity heads 106a-3 and/or 106b-3 may be move from any suitable manner that would enable moving from one edge of the wafer 108 to another diametrically opposite edge. In one embodiment, the proximity head 106a-3 and/or the proximity head 106b-3 may move in directions 121 (e.g., top to bottom or bottom to top of FIG. 5C). Therefore, the wafer 108 may stay stationary without any rotation or movement and the proximity heads 106a-3 and/or the proximity head 106b-3 may move into close proximity of the wafer and, through one pass over the wafer 108, clean/dry the top and/or bottom surface of the wafer 108.

Figure 5D:
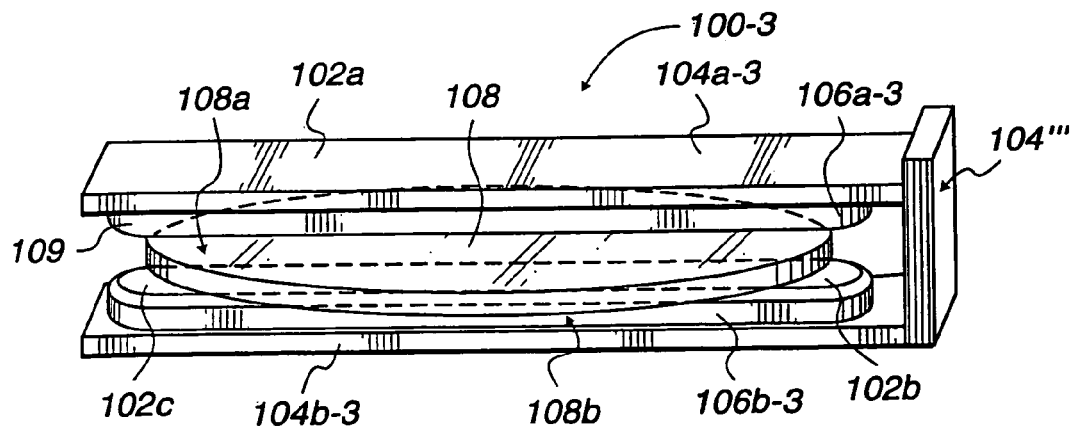
FIG. 5D shows a side view of a wafer cleaning and drying system with the proximity heads in a horizontal configuration which is configured to clean and/or dry the wafer that is stationary in accordance with one embodiment of the present invention.

FIG. 5D shows a side view of a wafer cleaning and drying system 100-3 with the proximity heads 106a-3 and 106b-3 in a horizontal configuration which is configured to clean and/or dry the wafer 108 that is stationary in accordance with one embodiment of the present invention. In this embodiment, the proximity head 106a-3 is in a horizontal position with the wafer 108 also in a horizontal position. By use of the proximity head 106a-3 and the proximity head 106b-3 that spans at least the diameter of the wafer 108, the wafer 108 may be cleaned and/or dried in one pass by moving proximity heads 106a-3 and 106b-3 in the direction 121 as discussed in reference to FIG. 5C.

Figure 5E:
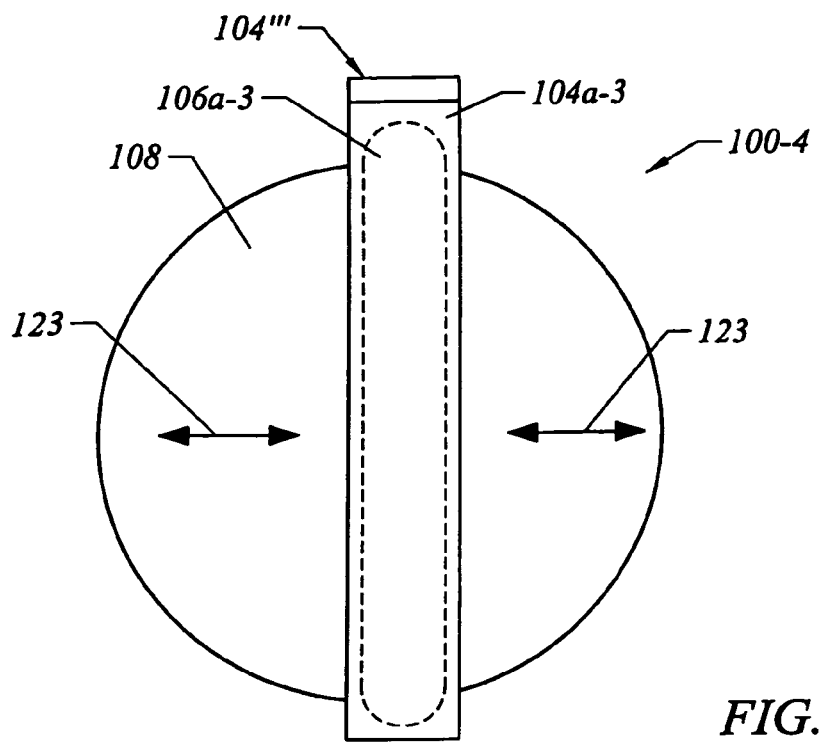
FIG. 5E shows a side view of a wafer cleaning and drying system with the proximity heads in a vertical configuration enabled to clean and/or dry the wafer that is stationary in accordance with one embodiment of the present invention.

FIG. 5E shows a side view of a wafer cleaning and drying system 100-4 with the proximity heads 106a-3 and 106b-3 in a vertical configuration enabled to clean and/or dry the wafer 108 that is stationary in accordance with one embodiment of the present invention. In this embodiment, the proximity heads 106a-3 and 106b-3 are in a vertical configuration, and the proximity heads 106a-3 and 106b-3 are configured to move either from left to right, or from right to left, beginning from a first edge of the wafer 108 to a second edge of the wafer 108 that is diametrically opposite to the first edge. Therefore, in such as embodiment, the proximity head carrier assembly 104''' may move the proximity heads 104a-3 and 104b-3 in close proximity with the wafer 108 and also enable the movement of the proximity heads 104a-3 and 104b-3 across the wafer from one edge to another so the wafer 108 may be processed in one pass thereby decreasing the time to clean and/or dry the wafer 108.

Figure 5F:
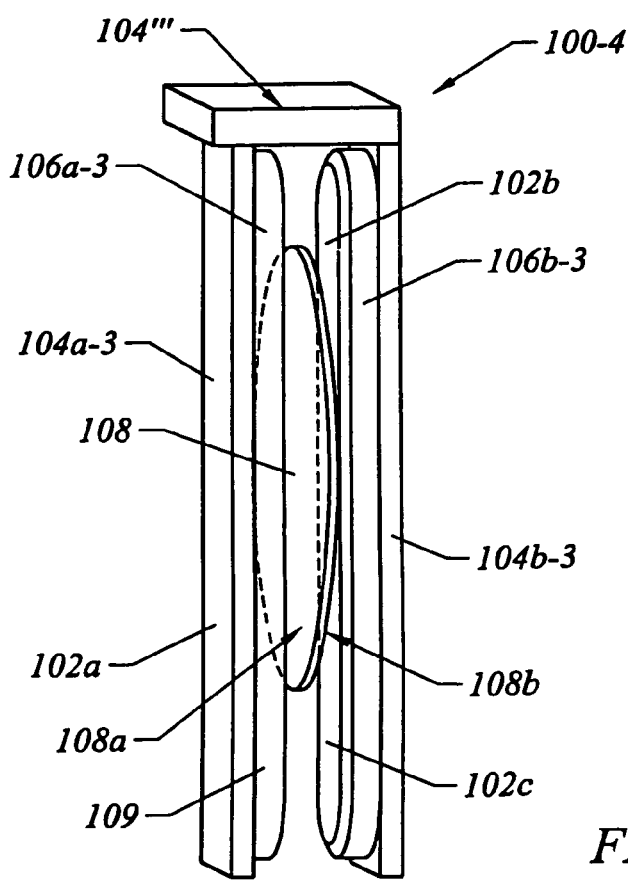
FIG. 5F shows an alternate side view of a wafer cleaning and drying system that is shifted 90 degrees from the side view shown in FIG. 5E in accordance with one embodiment of the present invention.

FIG. 5F shows an alternate side view of a wafer cleaning and drying system 100-4 that is shifted 90 degrees from the side view shown in FIG. 5E in accordance with one embodiment of the present invention. It should be appreciated that the proximity head carrier assembly 104''' may be oriented in any suitable manner such as for example, having the proximity head carrier assembly 104''' rotated 180 degrees as compared with what is shown in FIG. 5F.

Figure 5G:
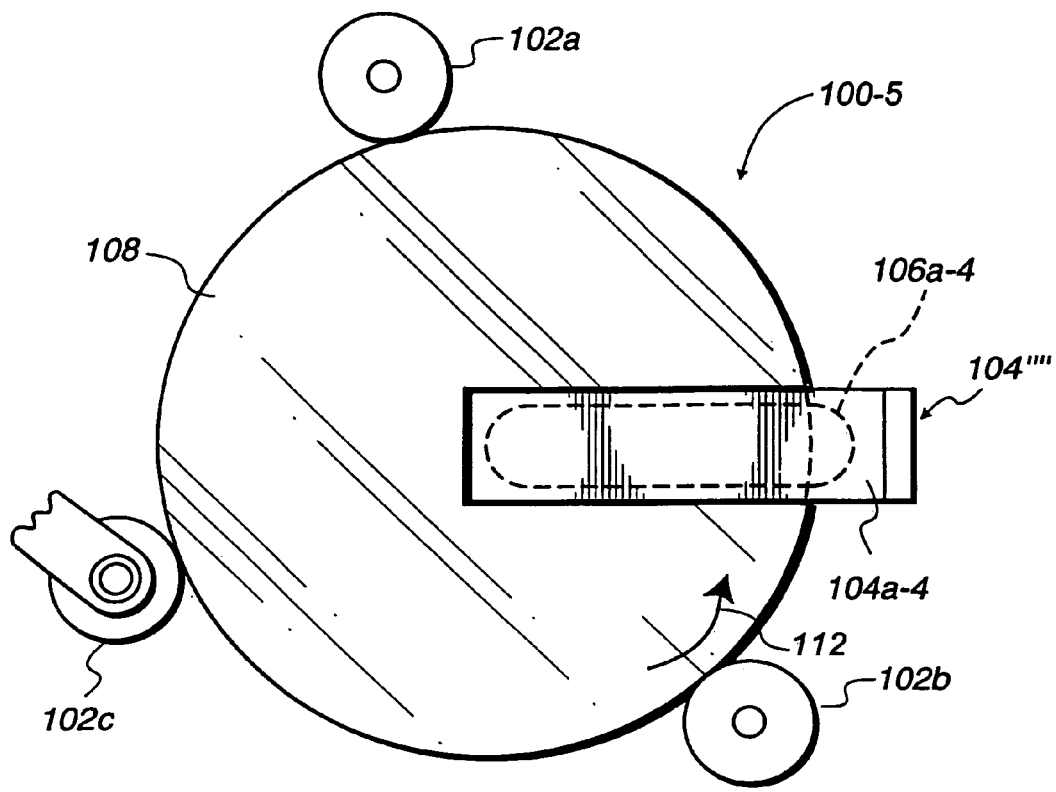
FIG. 5G shows a top view of a wafer cleaning and drying system with a proximity head in a horizontal configuration which extends across a radius of the wafer in accordance with one embodiment of the present invention.

FIG. 5G shows a top view of a wafer cleaning and drying system 100-5 with a proximity head 106a-4 in a horizontal configuration which extends across a radius of the wafer 108 in accordance with one embodiment of the present invention. In one embodiment, the proximity head 106a-4 extends across less than a radius of a substrate being processed. In another embodiment, the proximity head 106a-4 may extend the radius of the substrate being processed. In a preferable embodiment, the proximity head 106a-4 extends over a radius of the wafer 108 so the proximity head may process both the center point of the wafer 108 as well as an edge of the wafer 108 so the proximity head 106a-4 can cover and process the center point of the wafer and the edge of the wafer. In this embodiment, the proximity head 106a-4 may be moved into a cleaning/drying position by a vertical movement of the upper arm 104a-4 so the proximity head 106a-4 can be in a position that is in close proximity to the wafer 108. Once the proximity head 106a-4 is in close proximity to the wafer 108, the wafer processing operation of a top surface of the wafer 108 can take place. Because, in one embodiment, the proximity head 106a-4 extends over the radius of the wafer, the wafer may be cleaned and/or dried in one rotation.

Figure 5H:
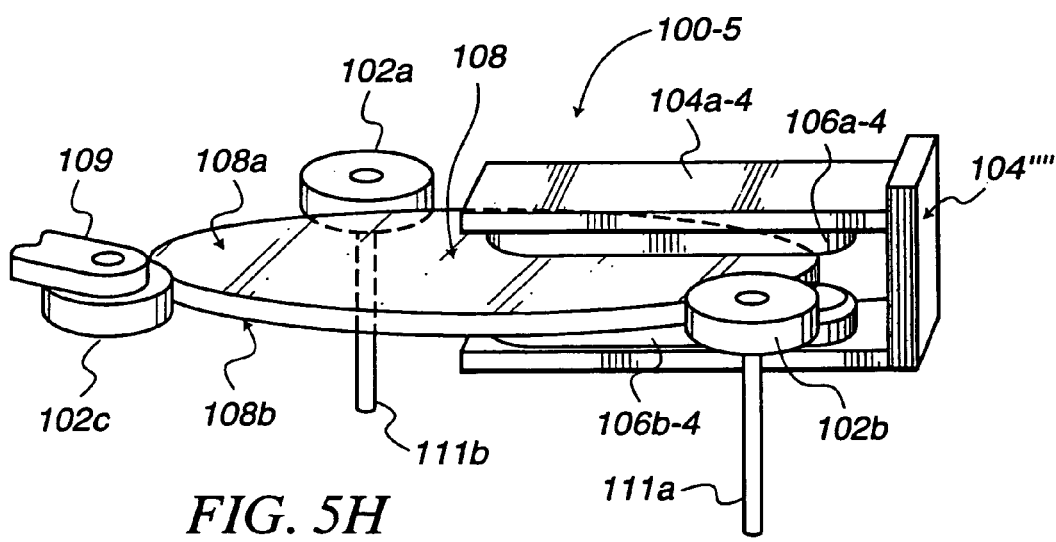
FIG. 5H shows a side view of a wafer cleaning and drying system with the proximity heads and in a horizontal configuration which extends across a radius of the wafer in accordance with one embodiment of the present invention.

FIG. 5H shows a side view of a wafer cleaning and drying system 100-5 with the proximity heads 106a-4 and 106b-4 in a horizontal configuration which extends across a radius of the wafer 108 in accordance with one embodiment of the present invention. In this embodiment, the proximity head 106a-4 and the proximity head 106b-4 both are elongated to be able to extend over and beyond the radius of the wafer 108. As discussed in reference to FIG. 5G, depending on the embodiment desired, the proximity head 106a-4 may extend less than a radius, exactly a radius, or greater than a radius of the wafer 108. In one embodiment, while the wafer 108 is being rotated, the proximity heads 106a-4 and 106b-4 are brought to close proximity of the wafer surfaces 108a and 108b by the top arm 104a and a bottom arm 106b-4 respectively. Because in one embodiment, the proximity heads 106a-4 and 106b-4 extend across greater than the radius of the wafer 108, only a full rotation may be needed to clean/dry the wafer 108.

FIG. 6A shows a proximity head inlet/outlet orientation 117 that may be utilized to clean and dry the wafer 108 in accordance with one embodiment of the present invention. In one embodiment, the orientation 117 is a portion of a proximity head 106a where other source inlets 302 and 306 in addition to other source outlets 304 may be utilized in addition to the orientation 117 shown. The orientation 117 may include a source inlet 306 on a leading edge 109 with a source outlet 304 in between the source inlet 306 and the source outlet 302.

Figure 6B:
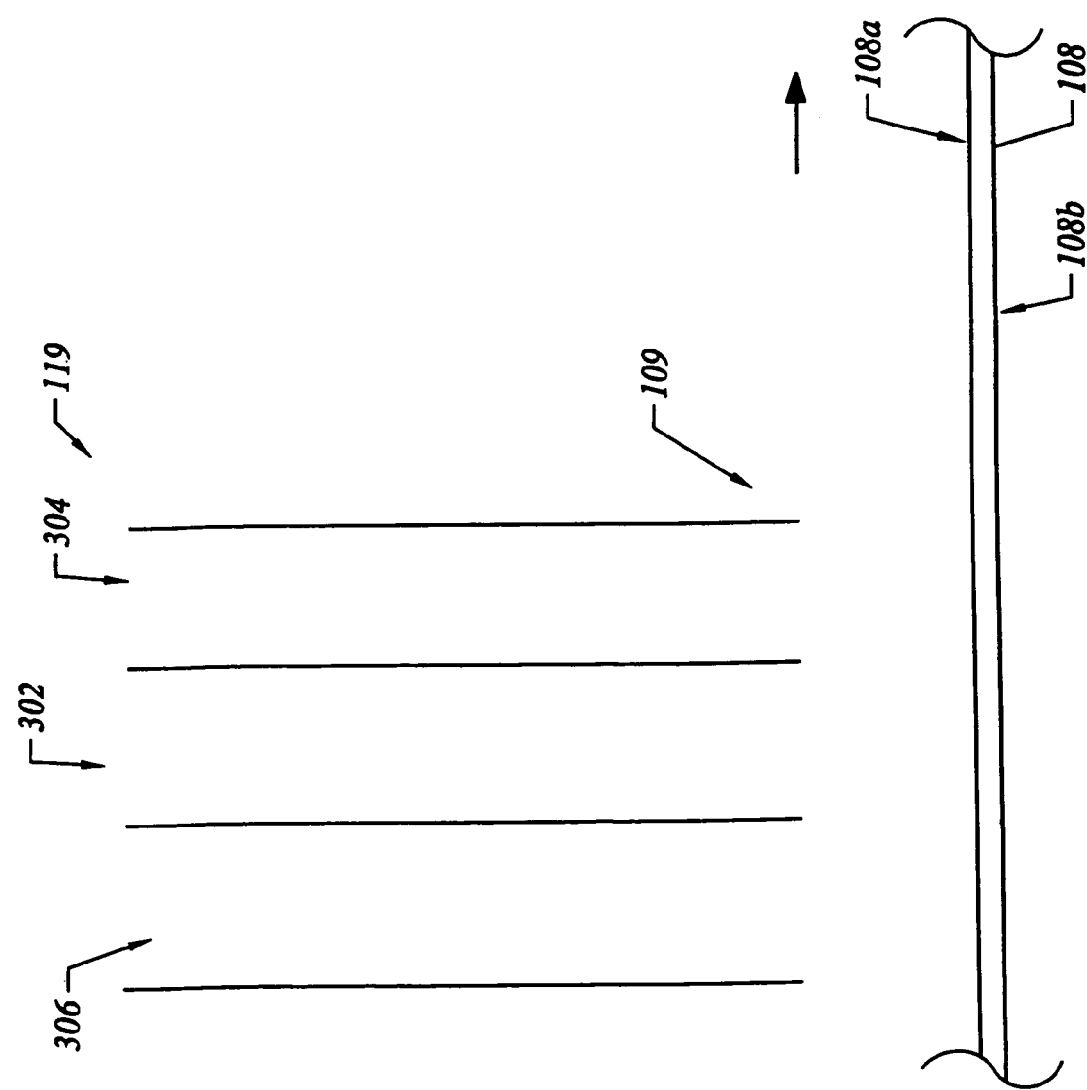
FIG. 6B shows another proximity head inlet/outlet orientation that may be utilized to clean and dry the wafer in accordance with one embodiment of the present invention.

FIG. 6B shows another proximity head inlet/outlet orientation 119 that may be utilized to clean and dry the wafer 108 in accordance with one embodiment of the present invention. In one embodiment, the orientation 119 is a portion of a proximity head 106a where other source inlets 302 and 306 in addition to other source outlets 304 may be utilized in addition to the orientation 119 shown. The orientation 119 may include a source outlet 304 on a leading edge 109 with a source inlet 302 in between the source outlet 304 and the source inlet 306.

FIG. 6C shows a further proximity head inlet/outlet orientation 121 that may be utilized to clean and dry the wafer 108 in accordance with one embodiment of the present invention. In one embodiment, the orientation 121 is a portion of a proximity head 106a where other source inlets 302 and 306 in addition to other source outlets 304 may be utilized in addition to the orientation 119 shown. The orientation 119 may include a source inlet 306 on a leading edge 109 with a source inlet 302 in between the source outlet 304 and the source outlet 306.

Figure 6D:
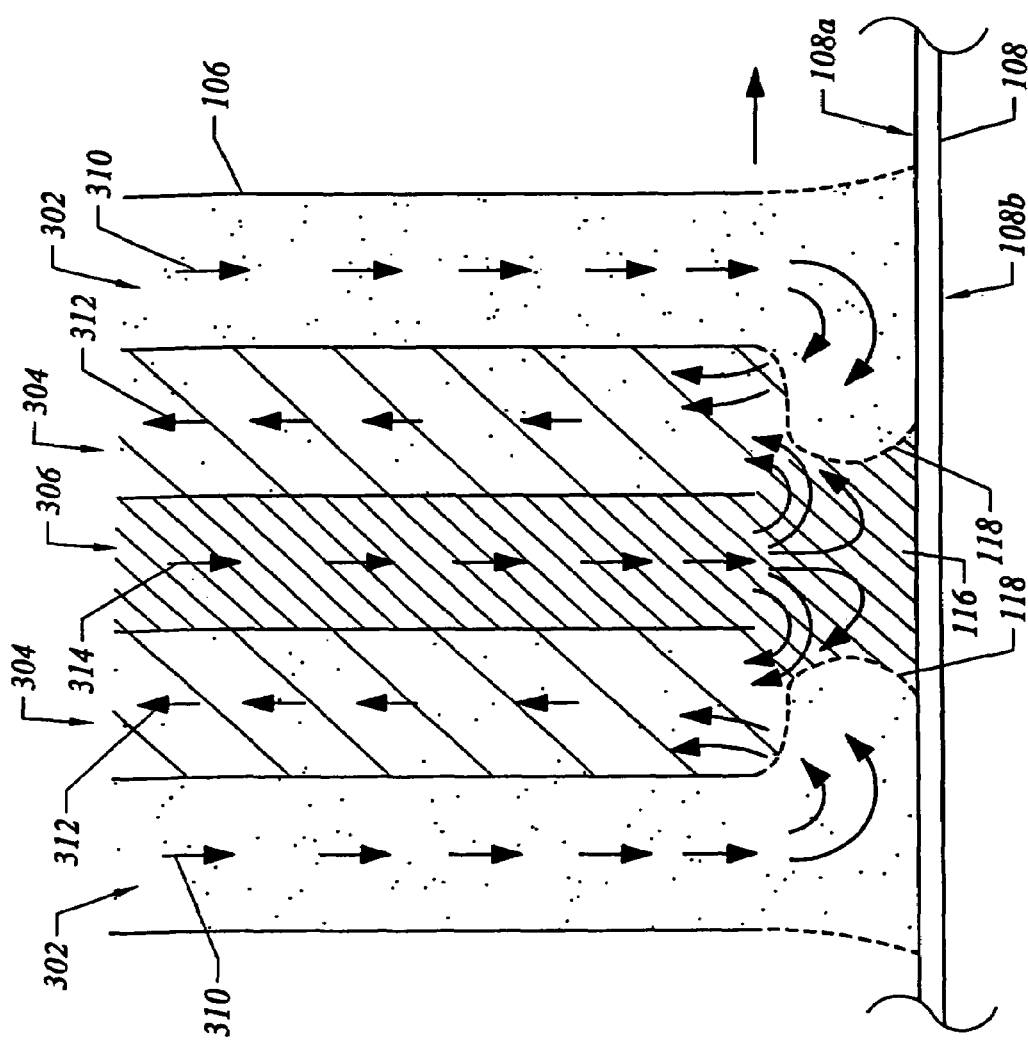
FIG. 6D illustrates a preferable embodiment of a wafer drying process that may be conducted by a proximity head in accordance with one embodiment of the present invention.

FIG. 6D illustrates a preferable embodiment of a wafer drying process that may be conducted by a proximity head 106a in accordance with one embodiment of the present invention. Although FIG. 6 shows a top surface 108a being dried, it should be appreciated that the wafer drying process may be accomplished in substantially the same way for the bottom surface 108b of the wafer 108. In one embodiment, a source inlet 302 may be utilized to apply isopropyl alcohol (IPA) vapor toward a top surface 108a of the wafer 108, and a source inlet 306 may be utilized to apply deionized water (DIW) toward the top surface 108a of the wafer 108. In addition, a source outlet 304 may be utilized to apply vacuum to a region in close proximity to the wafer surface to remove fluid or vapor that may located on or near the top surface 108a. It should be appreciated that any suitable combination of source inlets and source outlets may be utilized as long as at least one combination exists where at least one of the source inlet 302 is adjacent to at least one of the source outlet 304 which is in turn adjacent to at least one of the source inlet 306. The IPA may be in any suitable form such as, for example, IPA vapor where IPA in vapor form is inputted through use of a $N_2$ gas. Moreover, although DIW is utilized herein, any other suitable fluid may be utilized that may enable or enhance the wafer processing such as, for example, water purified in other ways, cleaning fluids, etc.

In one embodiment, an IPA inflow 310 is provided through the source inlet 302, a vacuum 312 may be applied through the source outlet 304 and DIW inflow 314 may be provided through the source inlet 306. Therefore, an embodiment of the IPA-vacuum-DIW orientation as described above in reference to FIG. 2 is utilized. Consequently, if a fluid film resides on the wafer 108, a first fluid pressure may be applied to the wafer surface by the IPA inflow 310, a second fluid pressure may be applied to the wafer surface by the DIW inflow 314, and a third fluid pressure may be applied by the vacuum 312 to remove the DIW, IPA and the fluid film on the wafer surface.

Therefore, in one embodiment, as the DIW inflow 314 and the IPA inflow 310 is applied toward a wafer surface, any fluid on the wafer surface is intermixed with the DIW inflow 314. At this time, the DIW inflow 314 that is applied toward the wafer surface encounters the IPA inflow 310. The IPA forms an interface 118 (also known as an IPA/DIW interface 118) with the DIW inflow 314 and along with the vacuum 312 assists in the removal of the DIW inflow 314 along with any other fluid from the surface of the wafer 108. In one embodiment, the IPA/DIW interface 118 reduces the surface of tension of the DIW. In operation, the DIW is applied toward the wafer surface and almost immediately removed along with fluid on the wafer surface by the vacuum applied by the source outlet 304. The DIW that is applied toward the wafer surface and for a moment resides in the region between a proximity head and the wafer surface along with any fluid on the wafer surface forms a meniscus 116 where the borders of the meniscus 116 are the IPA/DIW interfaces 118. Therefore, the meniscus 116 is a constant flow of fluid being applied toward the surface and being removed at substantially the same time with any fluid on the wafer surface. The nearly immediate removal of the DIW from the wafer surface prevents the formation of fluid droplets on the region of the wafer surface being dried thereby reducing the possibility of contamination drying on the wafer 108. The pressure (which is caused by the flow rate of the IPA) of the downward injection of IPA also helps contain the meniscus 116.

The flow rate of the IPA assists in causing a shift or a push of water flow out of the region between the proximity head and the wafer surface and into the source outlets 304 through which the fluids may be outputted from the proximity head. Therefore, as the IPA and the DIW is pulled into the source outlets 304, the boundary making up the IPA/DIW interface 118 is not a continuous boundary because gas (e.g., air) is being pulled into the source outlets 304 along with the fluids. In one embodiment, as the vacuum from the source outlet 304 pulls the DIW, IPA, and the fluid on the wafer surface, the flow into the source outlet 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/DIW interface 118. It should also be understood that the any suitable number of source inlets 302, source outlets 304 and source inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated any suitable flow rate may be utilized for the IPA, DIW, and vacuum as long as the meniscus 116 can be maintained. In one embodiment, the flow rate of the DIW through a set of the source inlets 306 is between about 25 ml per minute to about 3,000 ml per minute. In a preferable embodiment, the flow rate of the DIW through the set of the source inlets 306 is about 400 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more source inlets 302 and 306 and source outlets 304 More flow for larger head.

In one embodiment, the flow rate of the IPA vapor through a set of the source inlets 302 is between about 1 standard cubic feet per hour (SCFH) to about 100 SCFH. In a preferable embodiment, the IPA flow rate is between about 5 and 50 SCFH.

In one embodiment, the flow rate for the vacuum through a set of the source outlets 304 is between about 10 standard cubic feet per hour (SCFH) to about 1250 SCFH. In a preferable embodiment, the flow rate for a vacuum though the set of the source outlets 304 is about 350 SCFH. In an exemplary embodiment, a flow meter may be utilized to measure the flow rate of the IPA, DIW, and the vacuum.

Figure 6E:
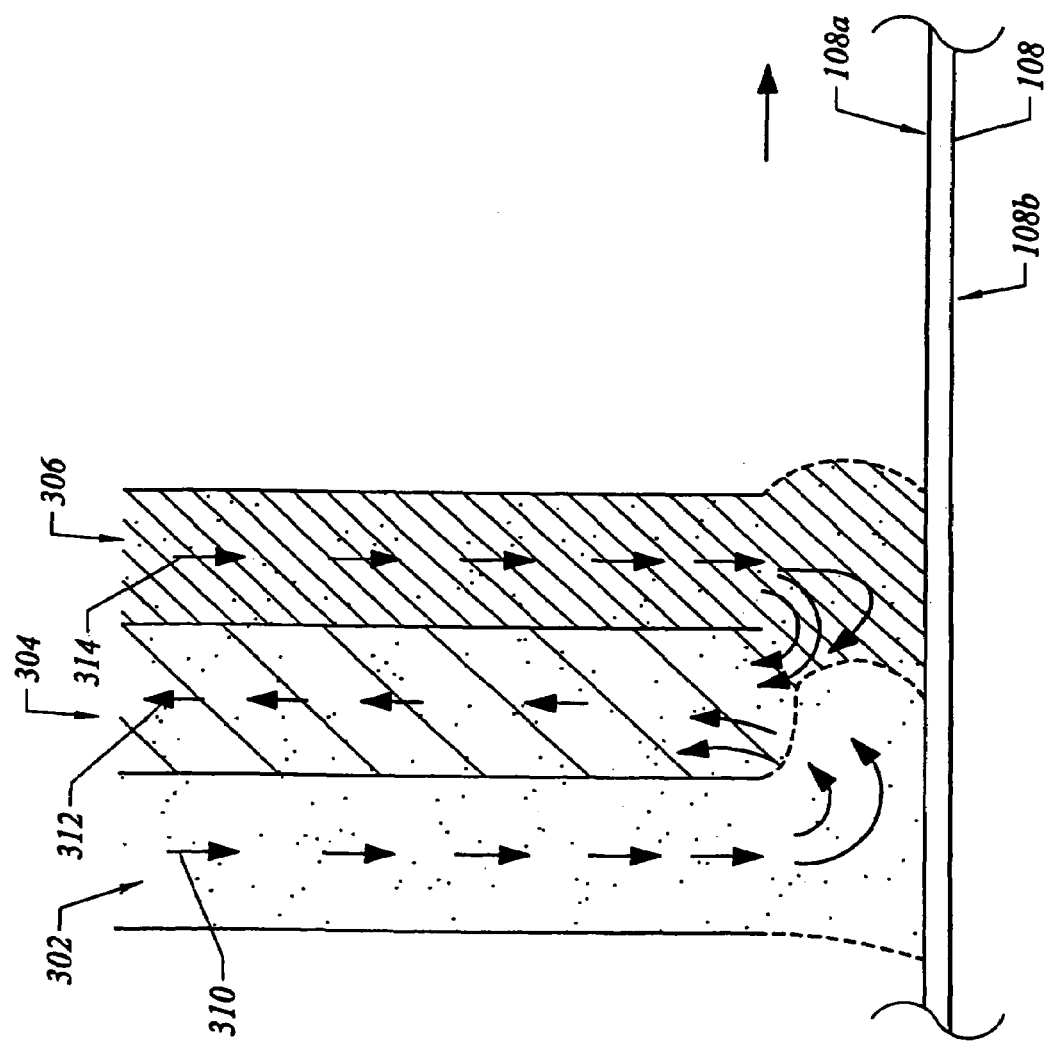
FIG. 6E shows another wafer drying process using another source inlet/outlet orientation that may be conducted by a proximity head in accordance with one embodiment of the present invention.

FIG. 6E shows another wafer drying process using another source inlet/outlet orientation that may be conducted by a proximity head 106a in accordance with one embodiment of the present invention. In this embodiment, the proximity head 106a may be moved over the top surface 108a of the wafer 108 so the meniscus may be moved along the wafer surface 108a. The meniscus applies fluid to the wafer surface and removes fluid from the wafer surface thereby cleaning and drying the wafer simultaneously. In this embodiment, the source inlet 306 applies a DIW flow 314 toward the wafer surface 108a, the source inlet 302 applies IPA flow 310 toward the wafer surface 108a, and the source outlet 312 removes fluid from the wafer surface 108a. It should be appreciated that in this embodiment as well as other embodiments of the proximity head 106a described herein, additional numbers and types of source inlets and source outlets may be used in conjunction with the orientation of the source inlets 302 and 306 and the source outlets 304 shown in FIG. 6E. In addition, in this embodiment as well as other proximity head embodiments, by controlling the amount of flow of fluids onto the wafer surface 108a and by controlling the vacuum applied, the meniscus may be managed and controlled in any suitable manner. For example, in one embodiment, by increasing the DIW flow 314 and/or decreasing the vacuum 312, the outflow through the source outlet 304 may be nearly all DIW and the fluids being removed from the wafer surface 108a. In another embodiment, by decreasing the DIW flow 314 and/or increasing the vacuum 312, the outflow through the source outlet 304 may be substantially a combination of DIW and air as well as fluids being removed from the wafer surface 108a.

Figure 6F:
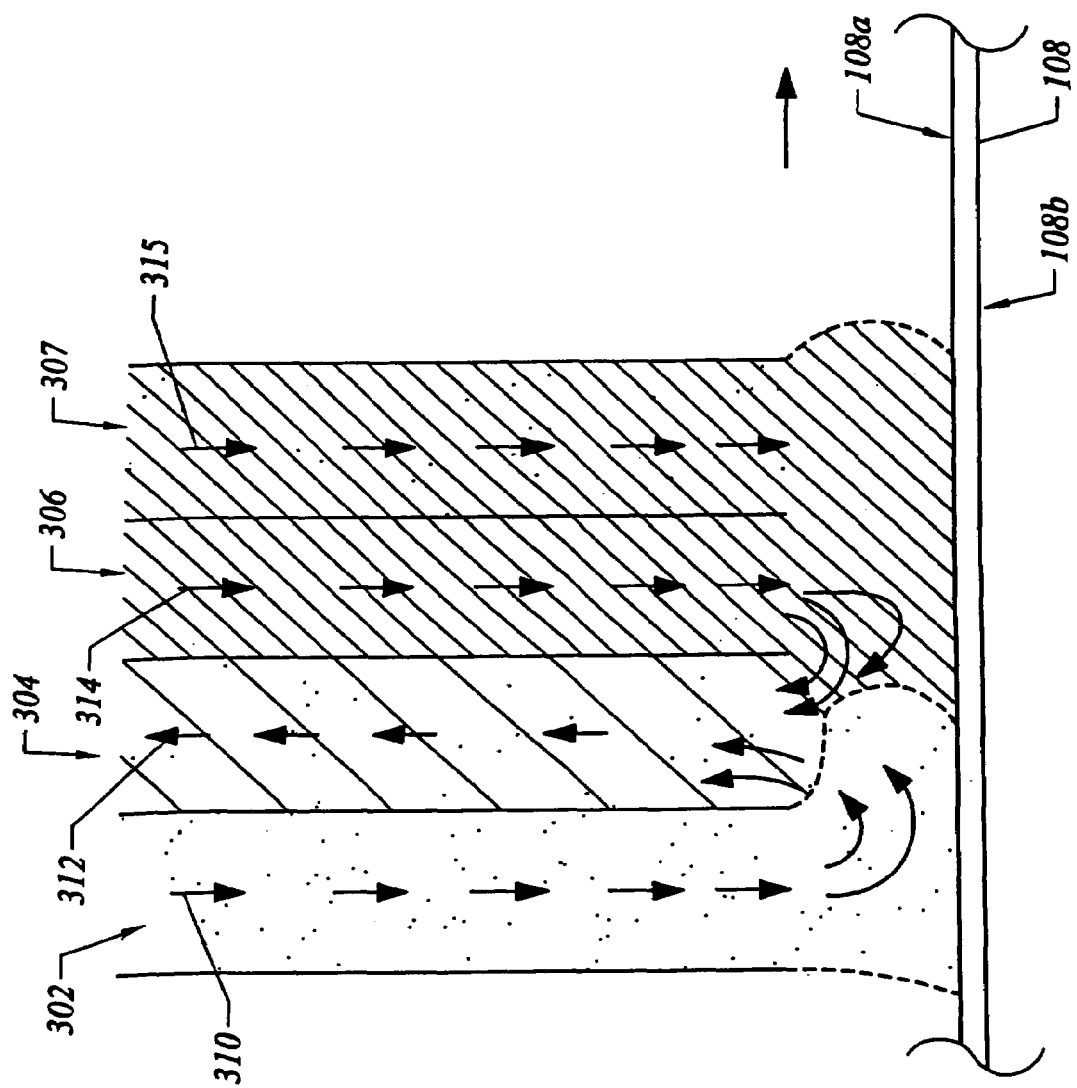
FIG. 6F shows another source inlet and outlet orientation where an additional source outlet may be utilized to input an additional fluid in accordance with one embodiment of the present invention.

FIG. 6F shows another source inlet and outlet orientation where an additional source outlet 307 may be utilized to input an additional fluid in accordance with one embodiment of the present invention. The orientation of inlets and outlets as shown in FIG. 6E is the orientation described in further detail in reference to FIG. 6D except the additional source outlet 307 is included adjacent to the source inlet 306 on a side opposite that of the source outlet 304. In such an embodiment, DIW may be inputted through the source inlet 306 while a different solution such as, for example, a cleaning solution may be inputted through the source inlet 307. Therefore, a cleaning solution flow 315 may be utilized to enhance cleaning of the wafer 108 while at substantially the same time drying the top surface 108a of the wafer 108.

FIG. 7A illustrates a proximity head 106 performing a drying operation in accordance with one embodiment of the present invention. The proximity head 106, in one embodiment, moves while in close proximity to the top surface 108a of the wafer 108 to conduct a cleaning and/or drying operation. It should be appreciated that the proximity head 106 may also be utilized to process (e.g., clean, dry, etc.) the bottom surface 108b of the wafer 108. In one embodiment, the wafer 108 is rotating so the proximity head 106 may be moved in a linear fashion along the head motion while fluid is removed from the top surface 108a. By applying the IPA 310 through the source inlet 302, the vacuum 312 through source outlet 304, and the deionized water 314 through the source inlet 306, the meniscus 116 as discussed in reference to FIG. 6 may be generated.

FIG. 7B shows a top view of a portion of a proximity head 106 in accordance with one embodiment of the present invention. In the top view of one embodiment, from left to right are a set of the source inlet 302, a set of the source outlet 304, a set of the source inlet 306, a set of the source outlet 304, and a set of the source inlet 302. Therefore, as IPA and DIW are inputted into the region between the proximity head 106 and the wafer 108, the vacuum removes the IPA and the DIW along with any fluid film that may reside on the wafer 108. The source inlets 302, the source inlets 306, and the source outlets 304 described herein may also be any suitable type of geometry such as for example, circular opening, square opening, etc. In one embodiment, the source inlets 302 and 306 and the source outlets 304 have circular openings.

Figure 7C:
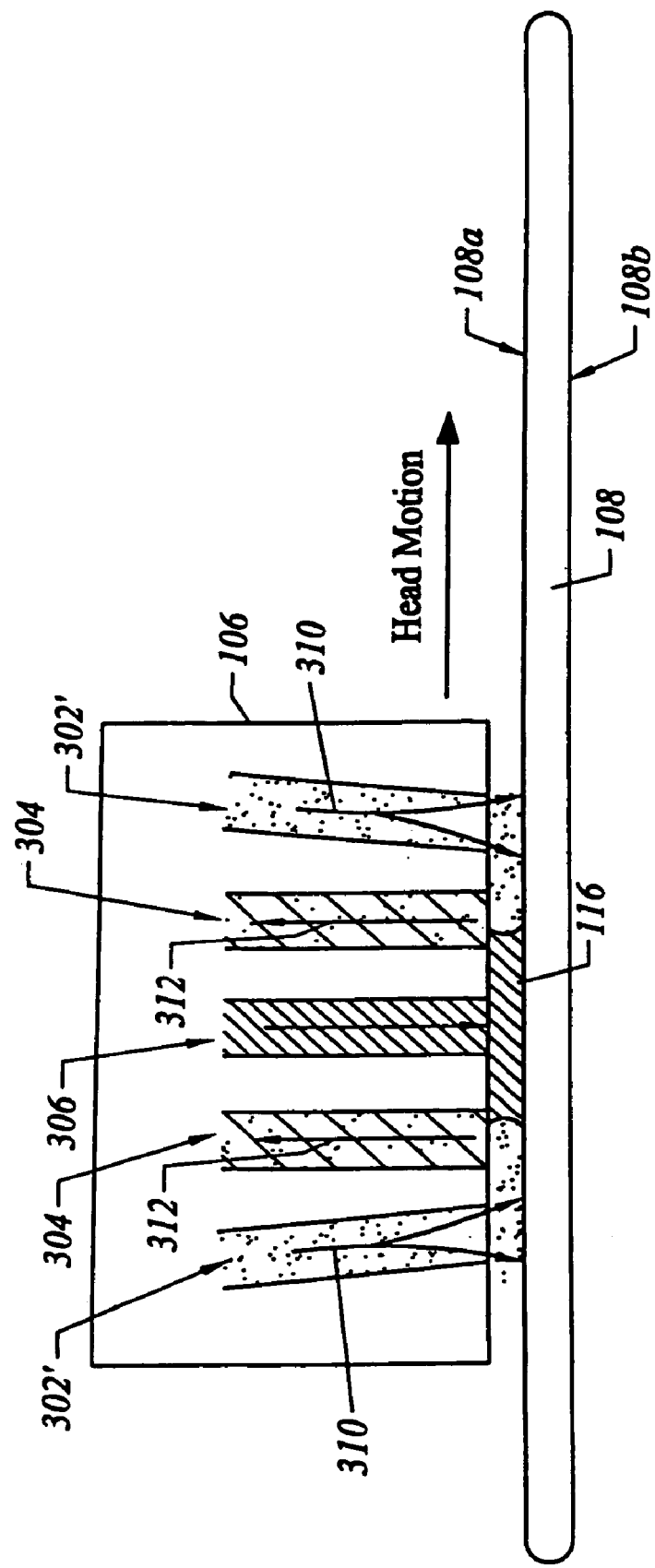
FIG. 7C illustrates a proximity head with angled source inlets performing a drying operation in accordance with one embodiment of the present invention.

FIG. 7C illustrates a proximity head 106 with angled source inlets 302' performing a drying operation in accordance with one embodiment of the present invention. It should be appreciated that the source inlets 302' and 306 and the source outlet(s) 304 described herein may be angled in any suitable way to optimize the wafer cleaning and/or drying process. In one embodiment, the angled source inlets 302' that input IPA vapor onto the wafer 108 is angled toward the source inlets 306 such that the IPA vapor flow is directed to contain the meniscus 116.

FIG. 7D illustrates a proximity head 106 with angled source inlets 302' and angled source outlets 304' performing a drying operation in accordance with one embodiment of the present invention. It should be appreciated that the source inlets 302' and 306 and the angled source outlet(s) 304' described herein may be angled in any suitable way to optimize the wafer cleaning and/or drying process.

In one embodiment, the angled source inlets 302' that input IPA vapor onto the wafer 108 is angled at an angle $\theta_{500}$ toward the source inlets 306 such that the PA vapor flow is directed to contain the meniscus 116. The angled source outlet 304' may, in one embodiment, be angled at an angle $\theta_{500}$ towards the meniscus 116. It should be appreciated that the angle $\theta_{500}$ and the angle $\theta_{502}$ may be any suitable angle that would optimize the management and control of the meniscus 116. In one embodiment, the angle $\theta_{500}$ is greater than 0 degrees and less than 90 degrees, and the angle $\theta_{502}$ is greater than 0 degrees and less than 90 degrees. In a preferable embodiment, the angle $\theta_{500}$ is about 15 degrees, and in another preferable embodiment, the angle angled at an angle $\theta_{502}$ is about 15 degrees. The angle $\theta_{500}$ and the angle $\theta_{502}$ adjusted in any suitable manner to optimize meniscus management. In one embodiment, the angle $\theta_{500}$ and the angle $\theta_{502}$ may be the same, and in another embodiment, the angle angle $\theta_{500}$ and the angle $\theta_{502}$ may be different. By angling the angled source inlet(s) 302' and/or angling the angled source outlet(s) 304', the border of the meniscus may be more clearly defined and therefore control the drying and/or cleaning the surface being processed.

Figure 8A:
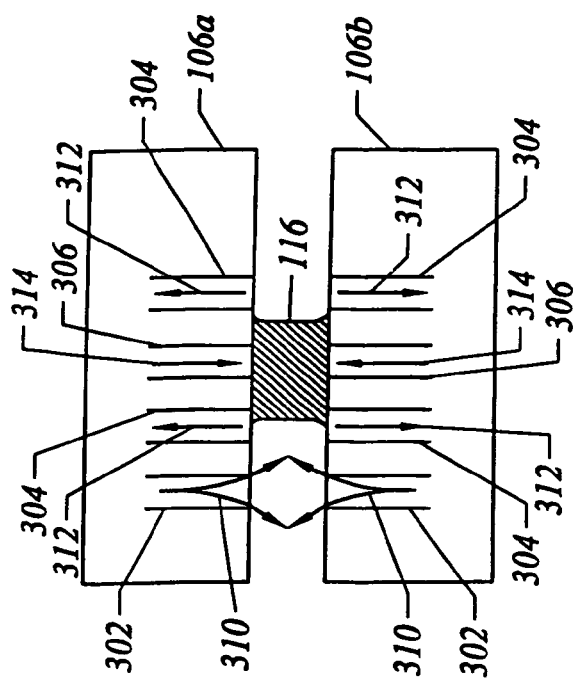
FIG. 8A illustrates a side view of the proximity heads for use in a dual wafer surface cleaning and drying system in accordance with one embodiment of the present invention.

FIG. 8A illustrates a side view of the proximity heads 106 and 106b for use in a dual wafer surface cleaning and drying system in accordance with one embodiment of the present invention. In this embodiment, by usage of source inlets 302 and 306 to input IPA and DIW respectively along with the source outlet 304 to provide a vacuum, the meniscus 116 may be generated. In addition, on the side of the source inlet 306 opposite that of the source inlet 302, there may be a source outlet 304 to remove DIW and to keep the meniscus 116 intact. As discussed above, in one embodiment, the source inlets 302 and 306 may be utilized for IPA inflow 310 and DIW inflow 314 respectively while the source outlet 304 may be utilized to apply vacuum 312. It should be appreciated that any suitable configuration of source inlets 302, source outlets 304 and source inlets 306 may be utilized. For example, the proximity heads 106 and 106b may have a configuration of source inlets and source outlets like the configuration described above in reference to FIGS. 7A and 7B. In addition, in yet more embodiments, the proximity heads 106 and 106b may be of a configuration as shown below in reference to FIGS. 9 through 15. Any suitable surface coming into contact with the meniscus 116 may be dried by the movement of the meniscus 116 into and away from the surface.

Figure 8B:
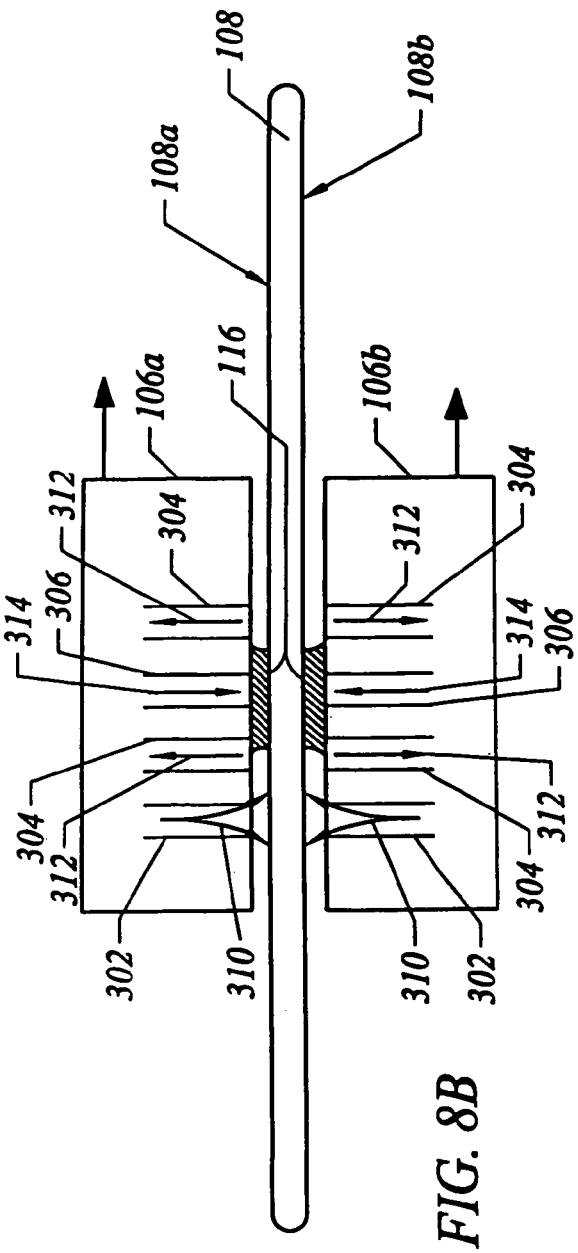
FIG. 8B shows the proximity heads in a dual wafer surface cleaning and drying system in accordance with one embodiment of the present invention.

FIG. 8B shows the proximity heads 106 and 106b in a dual wafer surface cleaning and drying system in accordance with one embodiment of the present invention. In this embodiment, the proximity head 106 processes the top surface 108a of the wafer 108, and the proximity head 106b processes the bottom surface of 108b of the wafer 108. By the inputting of the IPA and the DIW by the source inlets 302 and 306 respectively, and by use of the vacuum from the source outlet 304, the meniscus 116 may be formed between the proximity head 106 and the wafer 108 and between the proximity head 106b and the wafer 108. The proximity heads 106 and 106b, and therefore the meniscus 116, may be moved over the wet areas of the wafer surface in an manner so the entire wafer 108 can be dried.

Figure 9A:
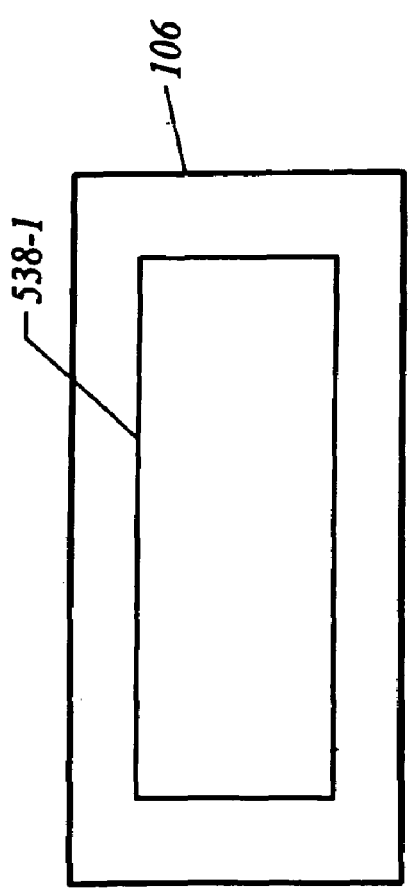
FIG. 9A illustrates a processing window in accordance with one embodiment of the present invention.

FIG. 9A illustrates a processing window 538-1 in accordance with one embodiment of the present invention. In one embodiment, the processing window 538-1 may include a plurality of source inlets 302 and 306 and also a plurality of source outlets 304. The processing window 538-1 is a region on a proximity head 106 (or any other proximity head referenced herein) that may generate and control the meniscus 116. Therefore, the processing window 538-1 may be a region that dries and/or cleans a wafer if the proximity head 106 is desired to be used in that manner. In one embodiment, the processing window 538-1 is a substantially rectangular shape. It should be appreciated that the size of the processing window 538-1 (or any other suitable processing window described herein) may be any suitable length and width (as seen from a top view).

Figure 9B:
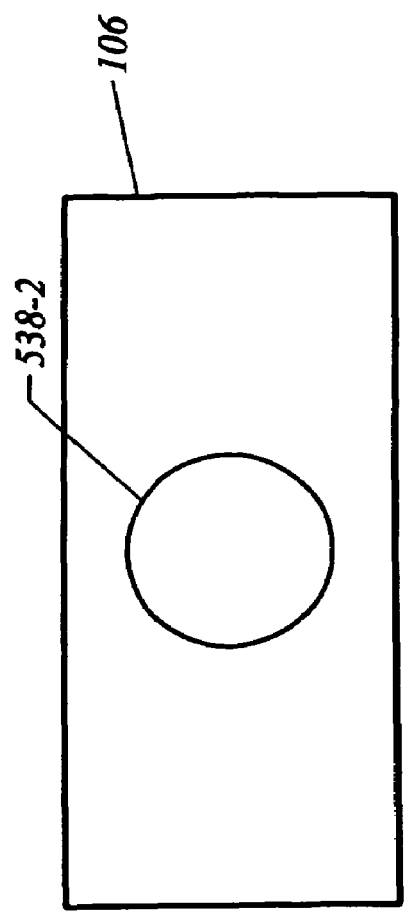
FIG. 9B illustrates a substantially circular processing window in accordance with one embodiment of the present invention.

FIG. 9B illustrates a substantially circular processing window 538-2 in accordance with one embodiment of the present invention. In one embodiment, the processing window 538-2 may include a plurality of source inlets 302 and 306 and also a plurality of source outlets 304. The processing window 538-2 is a region on the proximity head 106 (or any other proximity head referenced herein) that may generate and control the meniscus 116. Therefore, the processing window 538-2 may be a region that dries and/or cleans a wafer if the proximity head 106 is desired to be used in that manner. In one embodiment, the processing window 538-2 is a substantially circular shape.

Figure 9C:
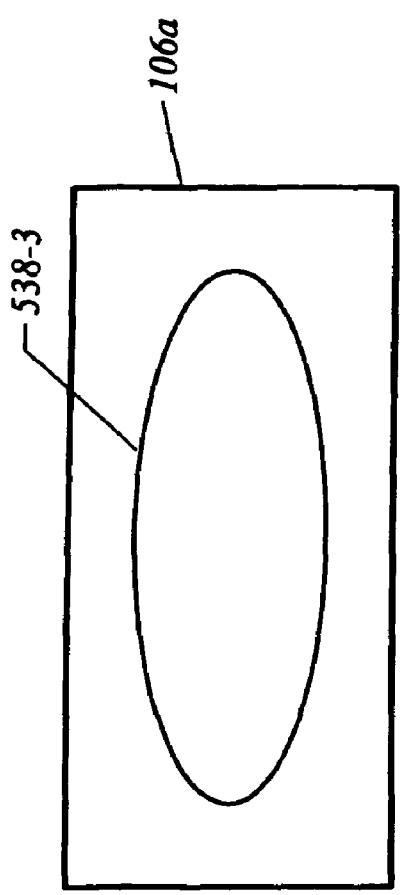
FIG. 9C illustrates a processing window in accordance with one embodiment of the present invention.

FIG. 9C illustrates a processing window 538-3 in accordance with one embodiment of the present invention. In one embodiment, the processing window 538-3 may include a plurality of source inlets 302 and 306 and also a plurality of source outlets 304. The processing window 538-3 is a region on the proximity head 106 (or any other proximity head referenced herein) that may generate and control the meniscus 116. Therefore, the processing window 538-3 may be a region that dries and/or cleans a wafer if the proximity head 106 is desired to be used in that manner. In one embodiment, the processing window 538-3 is a substantially oval in shape.

Figure 9D:
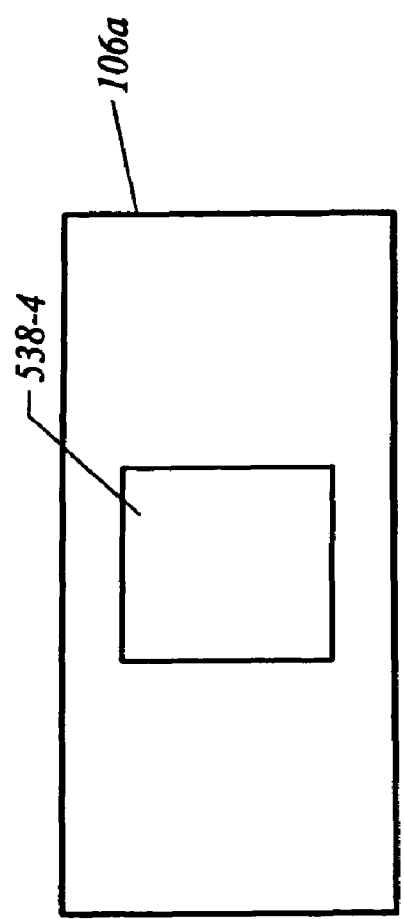
FIG. 9D illustrates a processing window in accordance with one embodiment of the present invention.

FIG. 9D illustrates a processing window 538-4 in accordance with one embodiment of the present invention. In one embodiment, the processing window 538-4 may include a plurality of source inlets 302 and 306 and also a plurality of source outlets 304. The processing window 538-4 is a region on the proximity head 106 (or any other proximity head referenced herein) that may generate and control the meniscus 116. Therefore, the processing window 538-4 may be a region that dries and/or cleans a wafer if the proximity head 106 is desired to be used in that manner. In one embodiment, the processing window 538-4 is a substantially square shape.

Figure 10A:
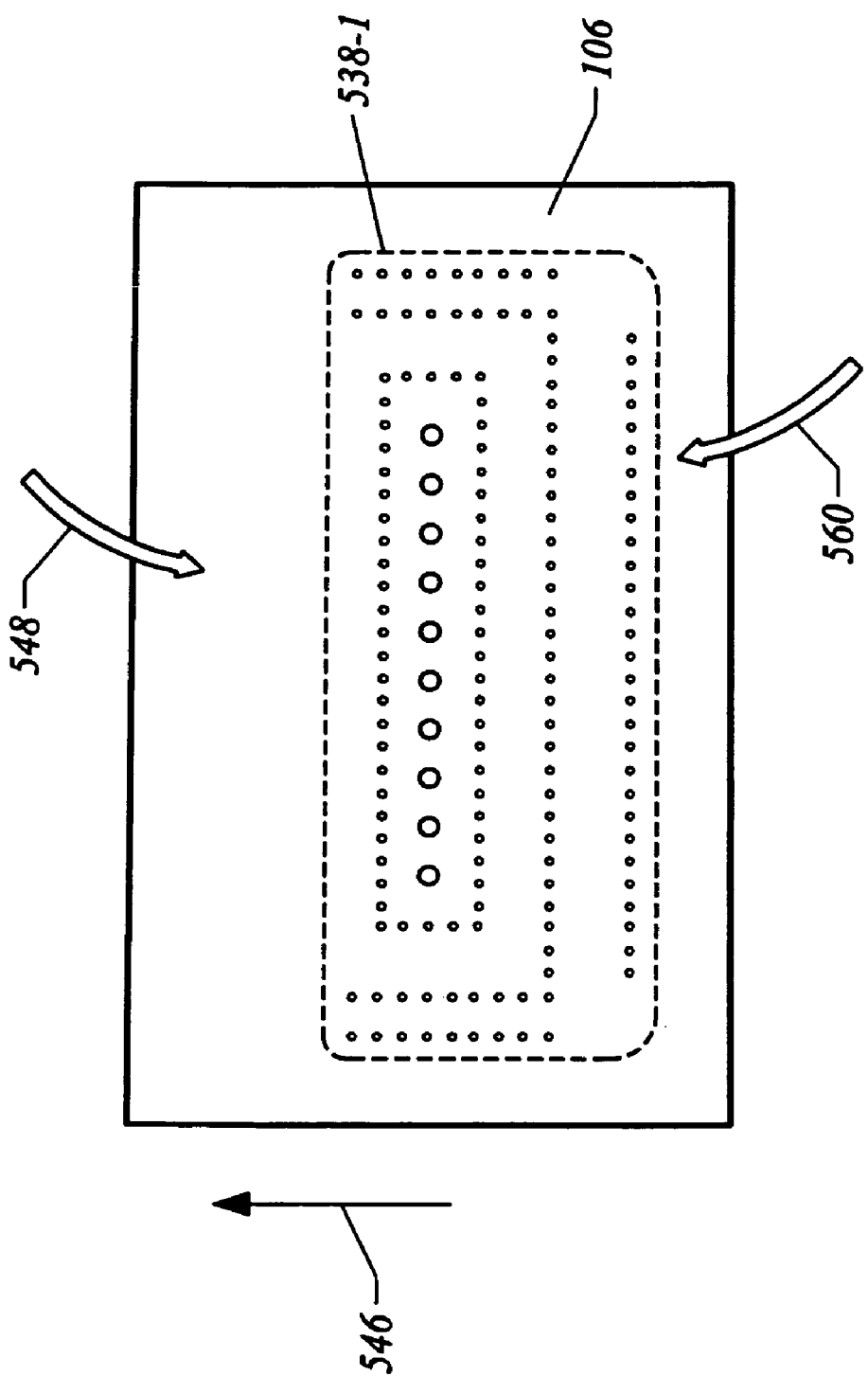
FIG. 10A shows an exemplary process window with the plurality of source inlets and as well as the plurality of source outlets in accordance with one embodiment of the present invention.

FIG. 10A shows an exemplary process window 538-1 with the plurality of source inlets 302 and 306 as well as the plurality of source outlets 304 in accordance with one embodiment of the present invention. In one embodiment, the process window 538-1 in operation may be moved in direction 546 across a wafer during, for example, a wafer drying operation. In such an embodiment, a proximity head 106 may encounter fluids on a wafer surface on a leading edge region 548. The leading edge region 548 is an area of the proximity head 106 that, in a drying process, encounters fluids first. Conversely a trailing edge region 560 is an area of the proximity head 106 that encounters the area being processed last. As the proximity head 106 and the process window 538-1 included therein move across the wafer in the direction 546, the wet area of the wafer surface enter the process window 538-1 through the leading edge region 548. Then after processing of the wet region of the wafer surface by the meniscus that is generated and controllably maintained and managed by the process window 538-1, the wet region is dried and the dried region of the wafer (or substrate) leaves the process window 538-1 through a trailing edge region 560 of the proximity head 106. As discussed in reference to FIGS. 9A through 9D, the process window 538-1 may be any suitable shape such as, for example, rectangular, square, circular, oval, semi-circular, etc.

Figure 10B:
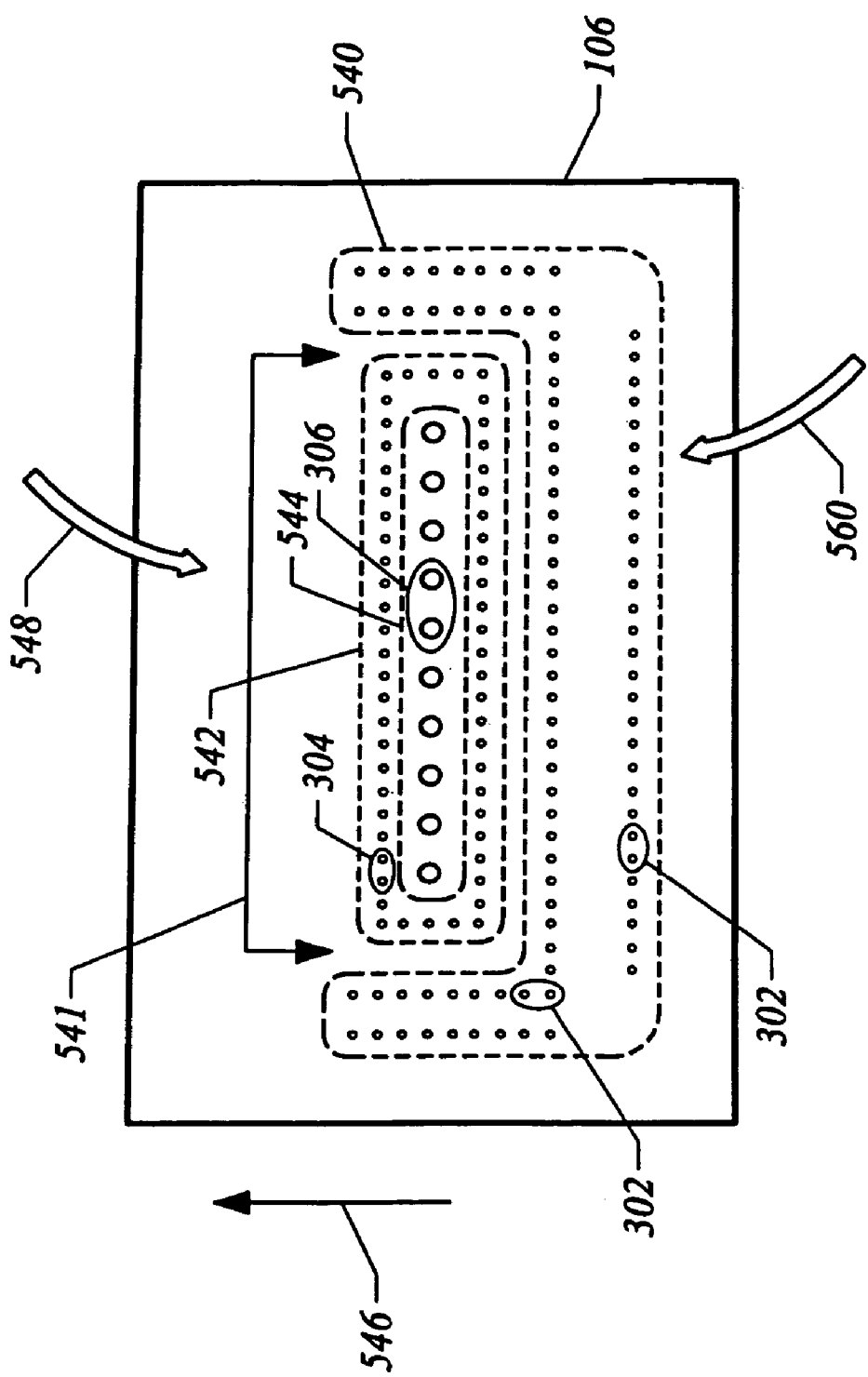
FIG. 10B shows processing regions of a proximity head in accordance with one embodiment of the present invention.

FIG. 10B shows processing regions 540, 542, and 544 of a proximity head 106 in accordance with one embodiment of the present invention. In one embodiment, the processing regions 540, 542, and 544 (the regions being shown by the broken lines) make up the processing window as discussed in reference to FIG. 10A. It should be appreciated that the processing regions 540, 542, and 544 may be any suitable size and/or shape such as, for example, circular, ring, semi-circular, square, semi-square, free form, etc. as long as a stable and controllable fluid meniscus can be generated that can apply and remove fluids from a surface in an efficient manner. In one embodiment, the processing region 540 includes the plurality of source inlets 302, the processing region 542 (also known as a vacuum ring) includes the plurality of source outlets 304, and the processing region 544 includes the plurality of source inlets 306. In a preferable embodiment, the region 542 surrounds (or substantially surrounds) the region 544 with a ring of source outlets 304 (e.g., a vacuum ring). The region 540 substantially surrounds the region 544 but has an opening 541 where there are no source inlets 302 exist on a leading edge side of the process window 538-1. In yet another embodiment, the region 540 forms a semi-enclosure around the region 542. The opening in the semi-enclosure leads in the direction of the scanning/processing by the head 106. Therefore, in one embodiment, the proximity head 106 can supply a first fluid to a first region of the wafer surface from the region 544 and surround the first region of the wafer with a vacuum region using the region 542. The proximity head 106 can also semi-enclose the vacuum region with an applied surface tension reducing fluid applied from the region 540. In such as embodiment, the semi-enclosing generates an opening that leads to the vacuum region.

Therefore, in operation, the proximity head 106 generates a fluid meniscus by application of IPA, DIW, and vacuum, in the regions 540, 542, and 544 in the process window 538 (as shown in FIG. 10A). When the proximity head 106 is moving over the wafer surface in an exemplary drying operation, the wafer surface that moves through the opening 541 in the region 542 and contacts the meniscus 116 within the process window 538 is dried. The drying occurs because fluid that is on that portion of the wafer surface that contacts the meniscus 116 is removed as the meniscus moves over the surface. Therefore, wet surfaces of a wafer may enter the process window 538 through the opening 541 in the region 540 and by contacting the fluid meniscus may undergo a drying process.

It should be appreciated that although the plurality of source inlets 302, the plurality of source inlets 306, and the plurality of source outlets 304 are shown in this embodiment, other embodiments may be utilized where any suitable number of the source inlets 302, the source inlets 306, and the source outlets 304 may be utilized as long as the configuration and number of the plurality of source inlets 302, the source inlets 306, and the source outlets 306 may generate a stable, controllable fluid meniscus that can dry a surface of a substrate.

FIGS. 11 through 14 illustrate exemplary embodiments of the proximity head 106. It should be appreciated any of the different embodiments of the proximity head 106 described may be used as one or both of the proximity heads 106a and 106b described above in reference to FIGS. 2A through 5H. As shown by the exemplary figures that follow, the proximity head may be any suitable configuration or size that may enable the fluid removal process as described in FIGS. 6 to 10. Therefore, any, some, or all of the proximity heads described herein may be utilized in any suitable wafer cleaning and drying system such as, for example, the system 100 or a variant thereof as described in reference to FIGS. 2A to 2D. In addition, the proximity head may also have any suitable numbers or shapes of source outlets 304 and source inlets 302 and 306. It should be appreciated that the side of the proximity heads shown from a top view is the side that comes into close proximity with the wafer to conduct wafer processing. All of the proximity heads described in FIGS. 11 through 14 are manifolds that enable usage of the IPA-vacuum-DIW orientation in a process window or a variant thereof as described above in reference to FIGS. 2 through 10. The embodiments of the proximity head 106 as described below in reference to FIGS. 11 through 14 all have embodiments of the process window 538, and regions 540, 542, and 544 as described in reference to FIGS. 9A through 10B above. In addition, the proximity heads described herein may be utilized for either cleaning or drying operations depending on the fluid that is inputted and outputted from the source inlets 302 and 306, and the source outlets 304. In addition, the proximity heads described herein may have multiple inlet lines and multiple outlet lines with the ability to control the relative flow rates of liquid and/or vapor and/or gas through the outlets and inlets. It should be appreciated that every group of source inlets and source outlets can have independent control of the flows.

It should be appreciated that the size as well as the locations of the source inlets and outlets may be varied as long as the meniscus produced is stable. In one embodiment, the size of the openings to source inlets 302, source outlets 304, and source inlets 306 are between about 0.02 inch and about 0.25 inch in diameter. In a preferable embodiment, the size of the openings of the source inlets 306 and the source outlets 304 is about 0.06 inch, and the size of the openings of the source inlets 302 is about 0.03 inch.

In one embodiment the source inlets 302 and 306 in addition to the source outlets 304 are spaced about 0.03 inch and about 0.5 inch apart. In a preferable embodiment, the source inlets 306 are spaced 0.125 inch apart from each other and the source outlets 304 are spaced 0.125 inch apart and the source inlets 302 are spaced about 0.06 inch apart.

Additionally, the proximity heads may not necessarily be a "head" in configuration but may be any suitable configuration, shape, and/or size such as, for example, a manifold, a circular puck, a bar, a square, an oval puck, a tube, plate, etc., as long as the source inlets 302, and 306, and the source outlets 304 may be configured in a manner that would enable the generation of a controlled, stable, manageable fluid meniscus. In a preferable embodiment, the proximity head may be a type of manifold as described in reference to FIGS. 10A through 14C. The size of the proximity heads may be varied to any suitable size depending on the application desired. In one embodiment, the length (from a top view showing the process window) of the proximity heads may be between 1.0 inch to about 18.0 inches and the width (from a top view showing the process window) may be between about 0.5 inch to about 6.0 inches. Also when the proximity head may be optimized to process any suitable size of wafers such as, for example, 200 mm wafers, 300, wafers, etc. The process windows of the proximity heads may be arranged in any suitable manner as long as such a configuration may generate a controlled stable and manageable fluid meniscus.

Figure 11A:
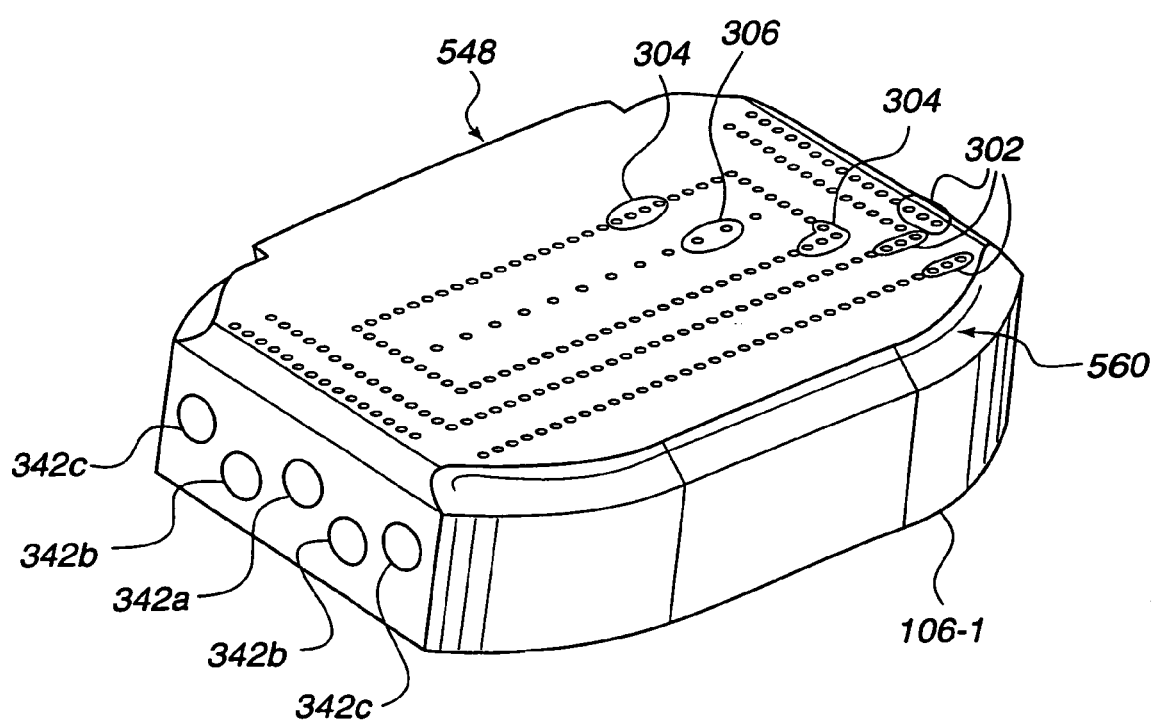
FIG. 11A shows a top view of a proximity head with a substantially rectangular shape in accordance with one embodiment of the present invention.

FIG. 11A shows a top view of a proximity head 106-1 with a substantially rectangular shape in accordance with one embodiment of the present invention. In this embodiment, the proximity head 106-1 includes three of the source inlets 302 which, in one embodiment, applies IPA to a surface of the wafer 108.

In this embodiment, the source inlets 302 are capable of applying IPA toward a wafer surface region, the source inlets 306 are capable of applying DIW toward the wafer surface region, and the source outlets 304 are capable of applying vacuum to a region in close proximity of a surface of the wafer 108. By the application of the vacuum, the IPA, DIW, and any other type of fluids that may reside on a wafer surface may be removed.

The proximity head 106-1 also includes ports 342a, 342b, and 342c that, in one embodiment, correspond to the source inlet 302, source outlet 304, and source inlet 306 respectively. By inputting or removing fluid through the ports 342a, 342b, and 342c, fluids may be inputted or outputted through the source inlet 302, the source outlet 304, and the source inlet 306. Although the ports 342a, 342b, and 342c correspond with the source inlet 302, the source outlet 304, and the source inlet 306 in this exemplary embodiment, it should be appreciated that the ports 342a, 342b, and 342c may supply or remove fluid from any suitable source inlet or source outlet depending on the configuration desired. Because of the configuration of the source inlets 302 and 306 with the source outlets 304, the meniscus 116 may be formed between the proximity head 106-1 and the wafer 108. The shape of the meniscus 116 may vary depending on the configuration and dimensions of the proximity head 106-1.

It should be appreciated that the ports 342a, 342b, and 342c for any of the proximity heads described herein may be any suitable orientation and dimension as long as a stable meniscus can be generated and maintained by the source inlets 302, source outlets 304, and source inlets 306. The embodiments of the ports 342a, 342b, and 342c described herein may be applicable to any of the proximity heads described herein. In one embodiment, the port size of the ports 342a, 342b, and 342c may be between about 0.03 inch and about 0.25 inch in diameter. In a preferable embodiment, the port size is about 0.06 inch to 0.18 inch in diameter. In one embodiment, the distance between the ports is between about 0.125 inch and about 1 inch apart. In a preferable embodiment, the distance between the ports is between about 0.25 inch and about 0.37 inch apart.

Figure 11B:
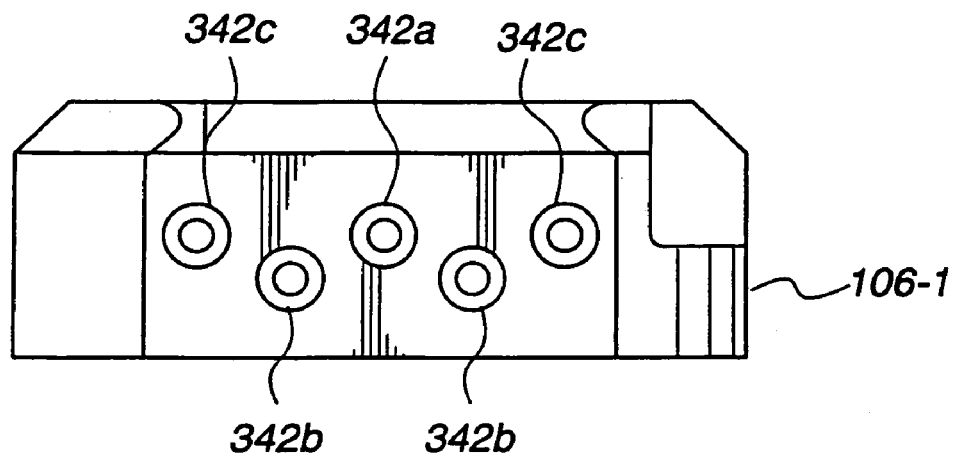
FIG. 11B illustrates a side view of the proximity head in accordance with one embodiment of present invention.

FIG. 11B illustrates a side view of the proximity head 106-1 in accordance with one embodiment of present invention. The proximity head 106-1 includes the ports 342a, 342b, and 342c. In one embodiment, the ports 342a, 342b, and 342c feed source inlets 302, source outlets 304, and the source inlets 306 respectively. It should be understood that the ports may be any suitable number, size, or shape as long as the source inlets 302 and 306 as well as source outlets 304 may be utilized to generate, maintain, and manage the meniscus 116.

Figure 11C:
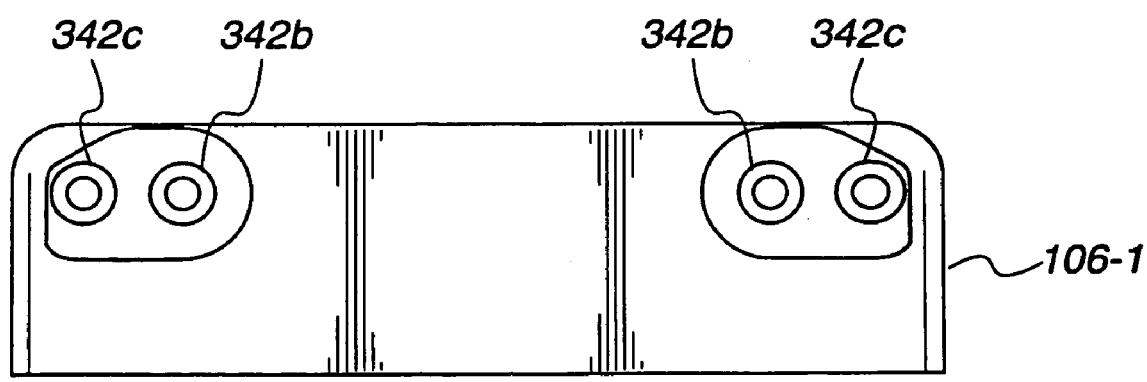
FIG. 11C shows a rear view of the proximity head in accordance with one embodiment of the present invention.

FIG. 11C shows a rear view of the proximity head 106-1 in accordance with one embodiment of the present invention. The rear view of the proximity head 106-1, in one embodiment, corresponds to the leading edge 548 of the proximity head 106-1. It should be appreciated that the proximity head 106-1 is exemplary in nature and may be any suitable dimension as long as the source inlets 302 and 306 as well as the source outlet 304 are configured in a manner to enable cleaning and/or drying of the wafer 108 in the manner described herein. In one embodiment, the proximity head 106-1 includes the input ports 342c which may feed fluid to at least some of the source inlets 302a which run parallel to the input ports 342c shown in FIG. 11C.

Figure 12A:
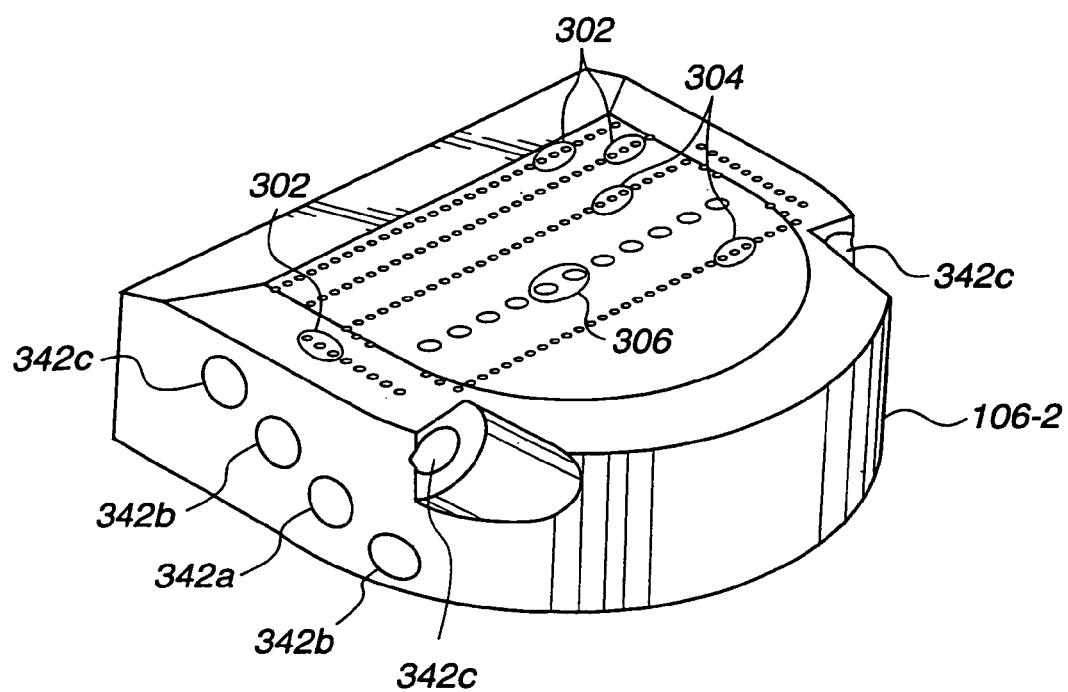
FIG. 12A shows a proximity head with a partial rectangular and partial circular shape in accordance with one embodiment of the present invention.

FIG. 12A shows a proximity head 106-2 with a partial rectangular and partial circular shape in accordance with one embodiment of the present invention. In this embodiment, the proximity head 106-2 includes one row of source inlets 306 that is adjacent on both sides to rows of source outlets 304. One of the rows of source outlets 304 is adjacent to two rows of source inlets 302. Perpendicular to and at the ends of the rows described above are rows of source outlets 304.

Figure 12B:
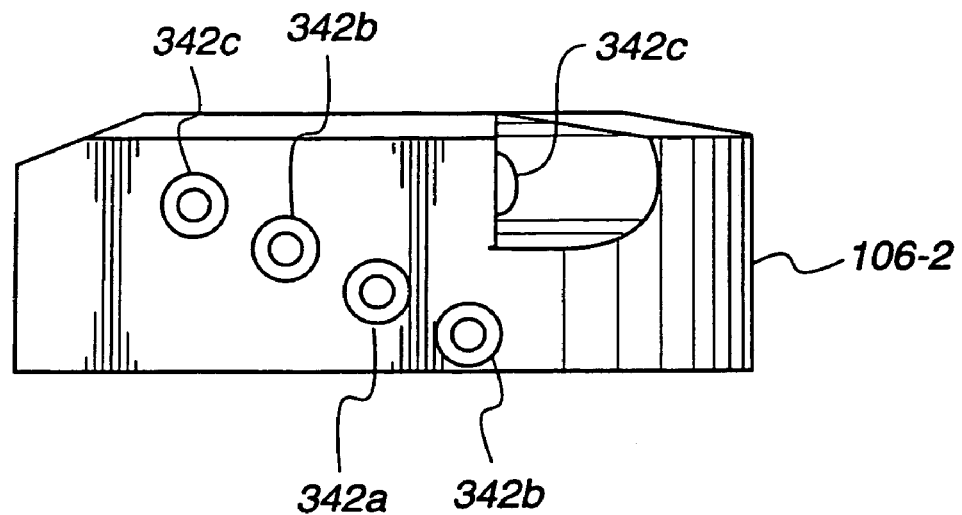
FIG. 12B shows a side view of the proximity head with a partial rectangular and partial circular shape in accordance with one embodiment of the present invention.

FIG. 12B shows a side view of the proximity head 106-2 with a partial rectangular and partial circular shape in accordance with one embodiment of the present invention. In one embodiment, the proximity head 106-2 includes ports 342a, 342b, and 342c on a side of the proximity head 106-2. The ports 342a, 342b, and 342c may be utilized to input and/or output fluids through the source inlets 302 and 306 and the source outlets 304. In one embodiment, the ports 342a, 342b, and 342c correspond to the source inlets 302, the source outlets 304, and the source inlets 306 respectively.

Figure 12C:
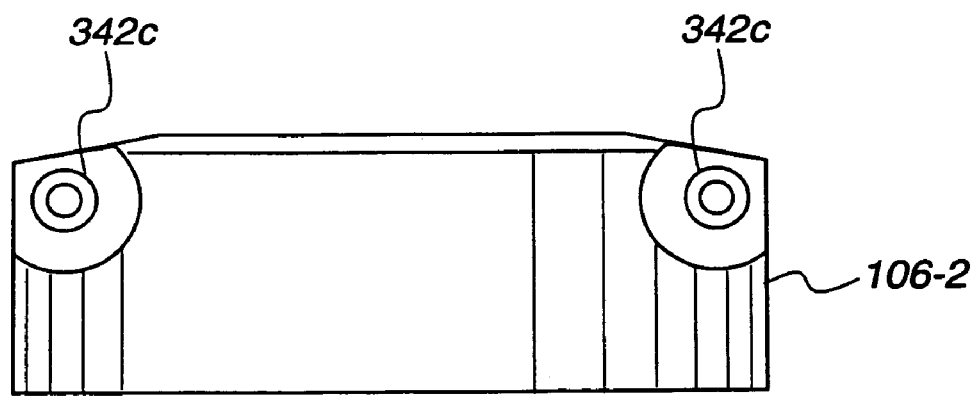
FIG. 12C shows a back view of the proximity head with a partial rectangular and partial circular shape in accordance with one embodiment of the present invention.

FIG. 12C shows a back view of the proximity head 106-2 with a partial rectangular and partial circular shape in accordance with one embodiment of the present invention. The back side as shown by the rear view is where the back side is the square end of the proximity head 106-2.

Figure 13A:
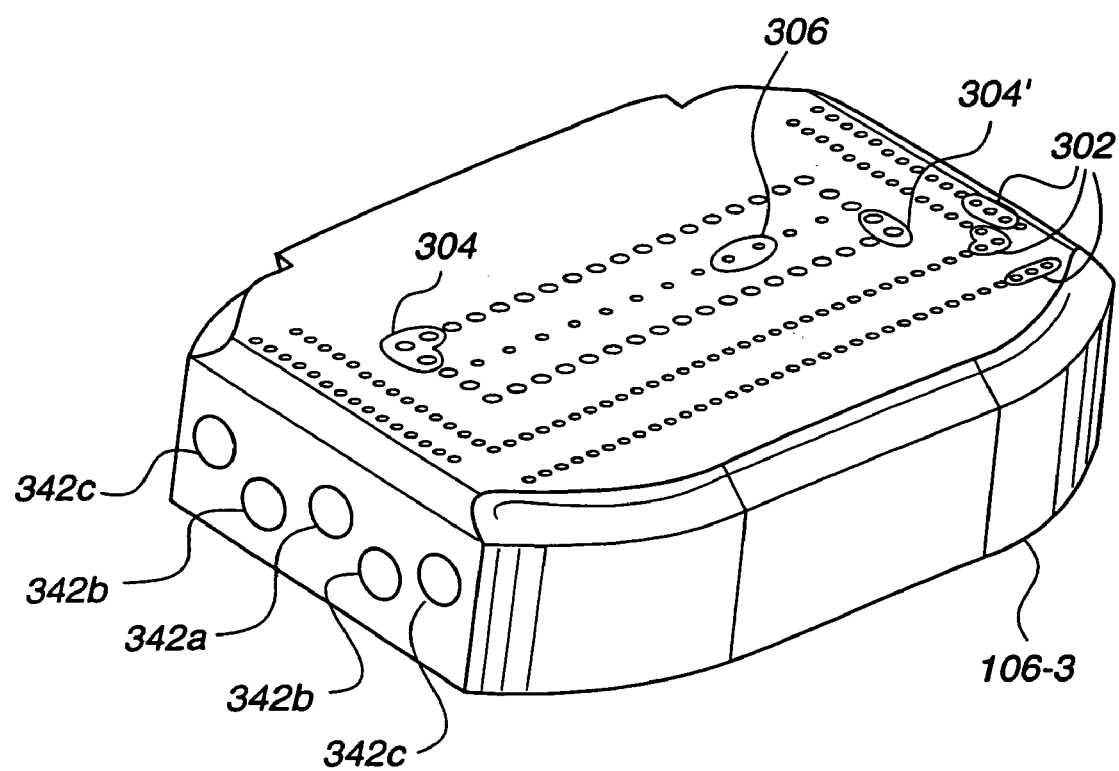
FIG. 13A shows a rectangular proximity head in accordance with one embodiment of the present invention.

FIG. 13A shows a rectangular proximity head 106-3 in accordance with one embodiment of the present invention. In one embodiment, the proximity head 106-3 includes a configuration of source inlets 302 and 306 and source outlets 304' that is similar to the proximity head 106-1 as discussed in reference to FIG. 11A. The rectangular proximity head 106-3 includes the source outlets 304' that are larger in diameter than the source outlets 304. In any of the proximity heads described herein, the diameter of the source inlets 302 and 306 as well as the source outlets 304 may be altered so meniscus generation, maintenance, and management may be optimized. In this embodiment, the source inlets 302 are capable of applying IPA toward a wafer surface region, the source inlets 306 are capable of applying DIW toward the wafer surface region, and the source outlets 304 are capable of applying vacuum to a region in close proximity of a surface of the wafer 108. By the application of the vacuum, the IPA, DIW, and any other type of fluids that may reside on a wafer surface may be removed.

The proximity head 106-3 also includes ports 342a, 342b, and 342c that, in one embodiment, correspond to the source inlet 302, source outlet 304, and source inlet 306 respectively. By inputting or removing fluid through the ports 342a, 342b, and 342c, fluids may be inputted or outputted through the source inlet 302, the source outlet 304, and the source inlet 306. Although the ports 342a, 342b, and 342c correspond with the source inlet 302, the source outlet 304, and the source inlet 306 in this exemplary embodiment, it should be appreciated that the ports 342a, 342b, and 342c may supply or remove fluid from any suitable source inlet or source outlet depending on the configuration desired. Because of the configuration of the source inlets 302 and 306 with the source outlets 304, the meniscus 116 may be formed between the proximity head 106-1 and the wafer 108. The shape of the meniscus 116 may vary depending on the configuration and dimensions of the proximity head 106-1.

It should be appreciated that the ports 342a, 342b, and 342c for any of the proximity heads described herein may be any suitable orientation and dimension as long as a stable meniscus can be generated and maintained by the source inlets 302, source outlets 304, and source inlets 306. The embodiments of the ports 342a, 342b, and 342c described in relation to the proximity head 106-1 may be applicable to any of the proximity heads described in reference to the other Figures. In one embodiment, the port size of the ports 342a, 342b, and 342c may be between about 0.03 inch and about 0.25 inch in diameter. In a preferable embodiment, the port size is about 0.06 inch to 0.18 inch in diameter. In one embodiment, the distance between the ports is between about 0.125 inch and about 1 inch apart. In a preferable embodiment, the distance between the ports is between about 0.25 inch and about 0.37 inch apart.

Figure 13B:
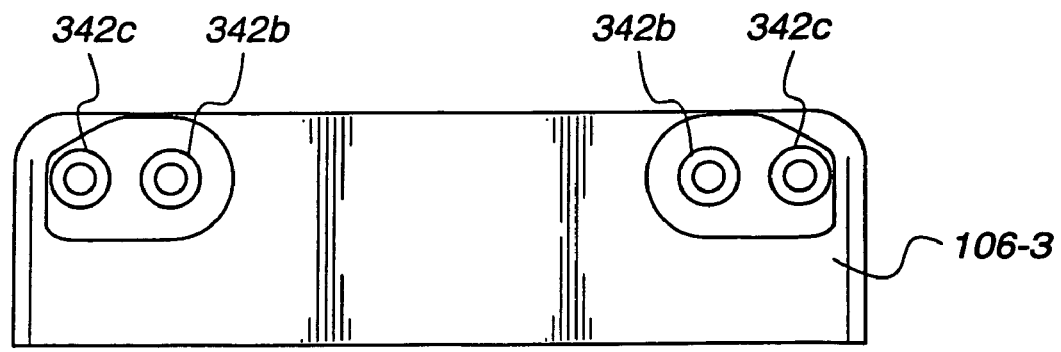
FIG. 13B shows a rear view of the proximity head in accordance with one embodiment of the present invention.

FIG. 13B shows a rear view of the proximity head 106-3 in accordance with one embodiment of the present invention. The rear view of the proximity head 106-3, in one embodiment, corresponds to the leading edge 548 of the proximity head 106-3. It should be appreciated that the proximity head 106-3 is exemplary in nature and may be any suitable dimension as long as the source inlets 302 and 306 as well as the source outlet 304 are configured in a manner to enable cleaning and/or drying of the wafer 108 in the manner described herein. In one embodiment, the proximity head 106-3 includes the input ports 342c which may feed fluid to at least some of the source inlets 302a which run parallel to the input ports 342c shown in FIG. 13A.

Figure 13C:
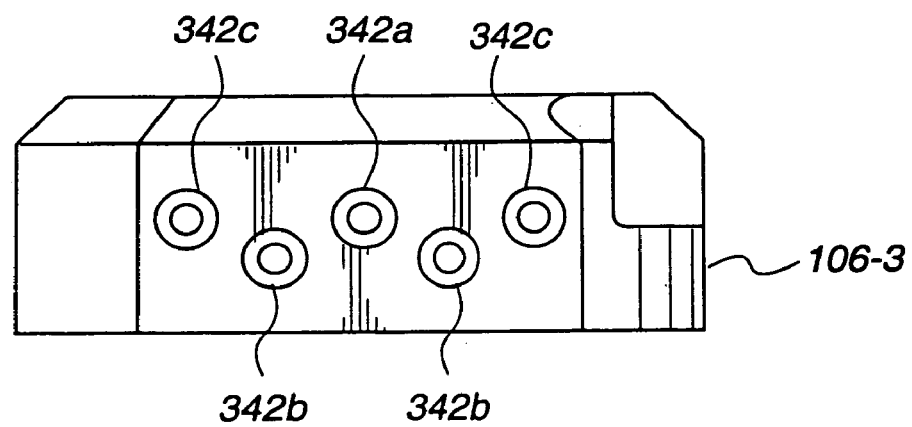
FIG. 13C illustrates a side view of the proximity head in accordance with one embodiment of present invention.

FIG. 13C illustrates a side view of the proximity head 106-3 in accordance with one embodiment of present invention. The proximity head 106-3 includes the ports 342a, 342b, and 342c. In one embodiment, the ports 342a, 342b, and 342c feed source inlets 302, source outlets 304, and the source inlets 306 respectively. It should be understood that the ports may be any suitable number, size, or shape as long as the source inlets 302 and 306 as well as source outlets 304 may be utilized to generate, maintain, and manage the meniscus 116.

Figure 14A:
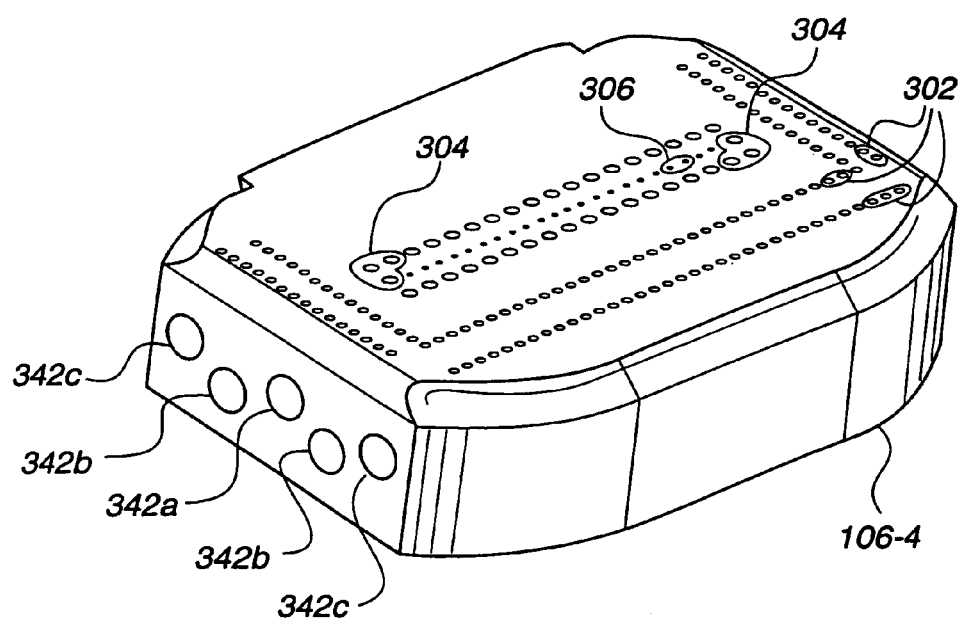
FIG. 14A shows a rectangular proximity head in accordance with one embodiment of the present invention.

FIG. 14A shows a rectangular proximity head 106-4 in accordance with one embodiment of the present invention. In one embodiment, the proximity head 106-4 includes a configuration of source inlets 302 and 306 and source outlets 304' that is similar to the proximity head 106-3 as discussed in reference to FIG. 13A. The rectangular proximity head 106-3 includes the source outlets 304' that are larger in diameter than the source outlets 304. In any of the proximity heads described herein, the diameter of the source inlets 302 and 306 as well as the source outlets 304 may be altered so meniscus generation, maintenance, and management may be optimized. In one embodiment, the source outlets 304' are located closer to the source inlets 302 than the configuration discussed in reference to FIG. 13A. With this type of configuration, a smaller meniscus may be generated. The region spanned by the source inlets 302, 306 and source outlets 304' (or also source outlets 304 as described in reference to FIG. 11A) may be any suitable size and/or shape. In one embodiment, the process window may be between about 0.03 square inches to about 9.0 square inches. In a preferable embodiment, the process window may be about 0.75. Therefore, by adjusting the region of the In this embodiment, the source inlets 302 are capable of applying IPA toward a wafer surface region, the source inlets 306 are capable of applying DIW toward the wafer surface region, and the source outlets 304 are capable of applying vacuum to a region in close proximity of a surface of the wafer 108. By the application of the vacuum, the IPA, DIW, and any other type of fluids that may reside on a wafer surface may be removed.

The proximity head 106-3 also includes ports 342a, 342b, and 342c that, in one embodiment, correspond to the source inlet 302, source outlet 304, and source inlet 306 respectively. By inputting or removing fluid through the ports 342a, 342b, and 342c, fluids may be inputted or outputted through the source inlet 302, the source outlet 304, and the source inlet 306. Although the ports 342a, 342b, and 342c correspond with the source inlet 302, the source outlet 304, and the source inlet 306 in this exemplary embodiment, it should be appreciated that the ports 342a, 342b, and 342c may supply or remove fluid from any suitable source inlet or source outlet depending on the configuration desired.

Because of the configuration of the source inlets 302 and 306 with the source outlets 304, the meniscus 116 may be formed by the process window between the proximity head 106-1 and the wafer 108. The shape of the meniscus 116 may correspond with the shape of the process window and therefore the size and shape of the meniscus 116 may be varied depending on the configuration and dimensions of the regions of source inlets 302 and 306 and regions of the source outlets 304.

Figure 14B:
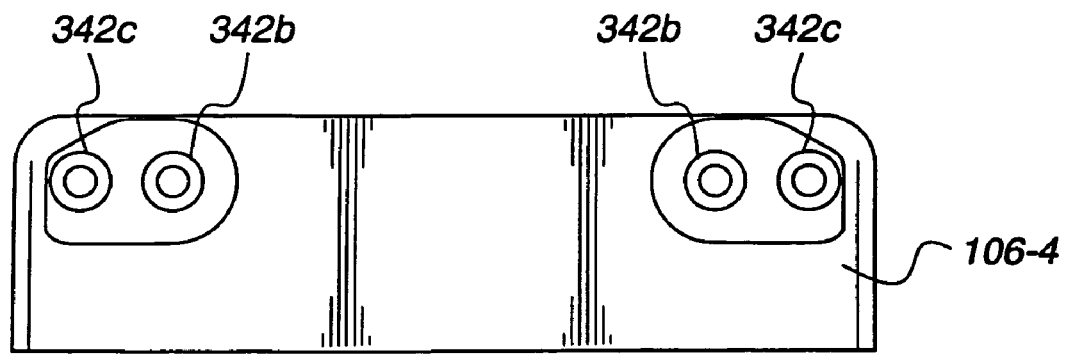
FIG. 14B shows a rear view of the rectangular proximity head in accordance with one embodiment of the present invention.

FIG. 14B shows a rear view of the rectangular proximity head 106-4 in accordance with one embodiment of the present invention. The rear view of the proximity head 106-4, in one embodiment, corresponds to the leading edge 548 of the proximity head 106-4. It should be appreciated that the proximity head 106-4 is exemplary in nature and may be any suitable dimension as long as the source inlets 302 and 306 as well as the source outlet 304 are configured in a manner to enable cleaning and/or drying of the wafer 108 in the manner described herein. In one embodiment, the proximity head 106-4 includes the input ports 342c which may feed fluid to at least some of the source inlets 302a which run parallel to the input ports 342c shown in FIG. 13A.

Figure 14C:
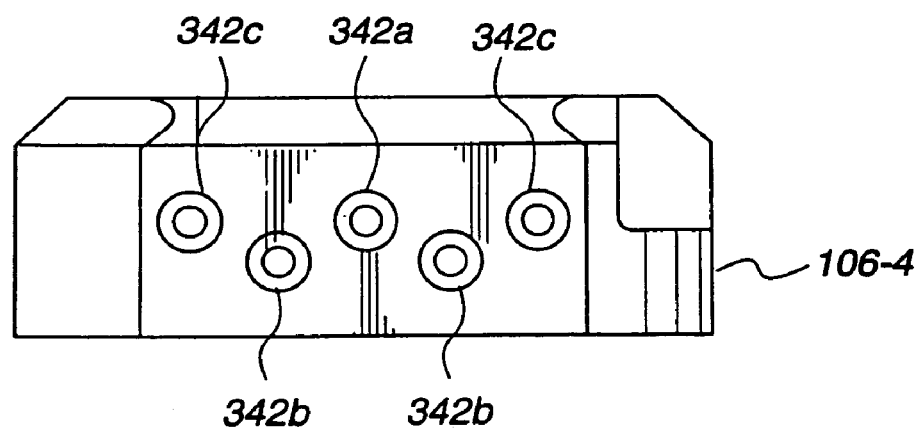
FIG. 14C illustrates a side view of the rectangular proximity head in accordance with one embodiment of present invention.

FIG. 14C illustrates a side view of the rectangular proximity head 106-4 in accordance with one embodiment of present invention. The proximity head 106-4 includes the ports 342a, 342b, and 342c. In one embodiment, the ports 342a, 342b, and 342c feed source inlets 302, source outlets 304, and the source inlets 306 respectively. It should be understood that the ports may be any suitable number, size, or shape as long as the source inlets 302 and 306 as well as source outlets 304 may be utilized to generate, maintain, and manage the meniscus 116.

Figure 15A:
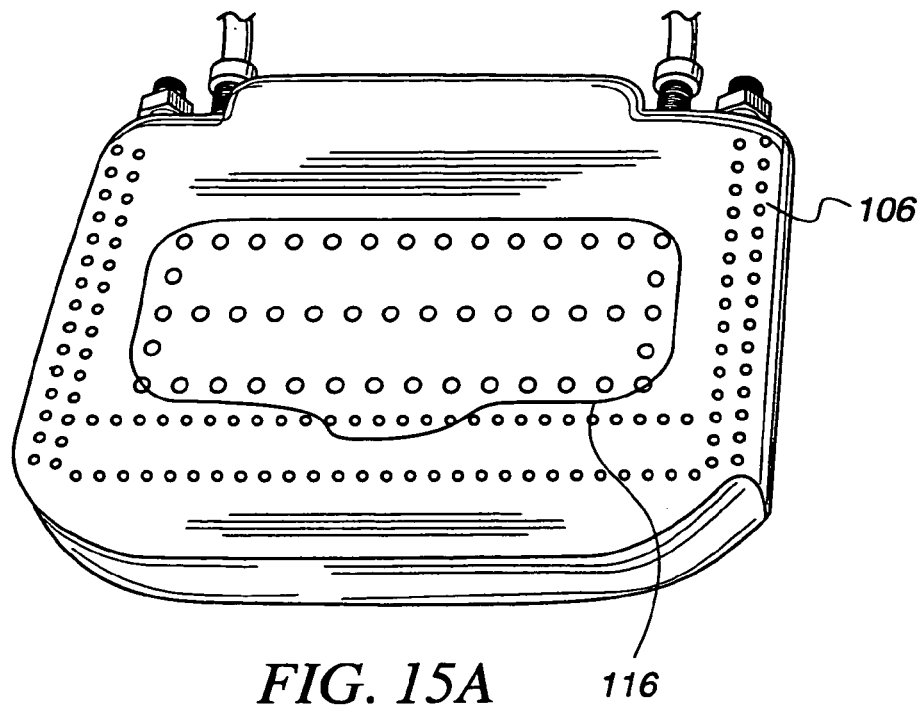
FIG. 15A shows a proximity head in operation according to one embodiment of the present invention.

FIG. 15A shows a proximity head 106 in operation according to one embodiment of the present invention. It should be appreciated that the flow rate of the DIW and the IPA, the magnitude of the vacuum, and rotation/movement of the wafer being processed may be varied in any suitable manner to provide optimal fluid meniscus controllability and management to generate enhanced wafer processing. The proximity head 106, in one exemplary embodiment, is utilized in a configuration as described in reference to FIG. 2A. As shown in reference to FIGS. 15A through 15F, the wafer is a clear material so fluid meniscus dynamics can be seen with different flow rates, vacuum rates, and wafer rotations. The flow rate of DIW and IPA as well as the vacuum and rotation of the wafer may be varied depending on the conditions encountered during drying. In FIG. 15A, the meniscus has been formed by input of DIW and vacuum without any IPA flow. Without the IPA flow, the meniscus has an uneven boundary. In this embodiment, the wafer rotation is zero and the DIW flow rate is 500 ml/min.

Figure 15B:
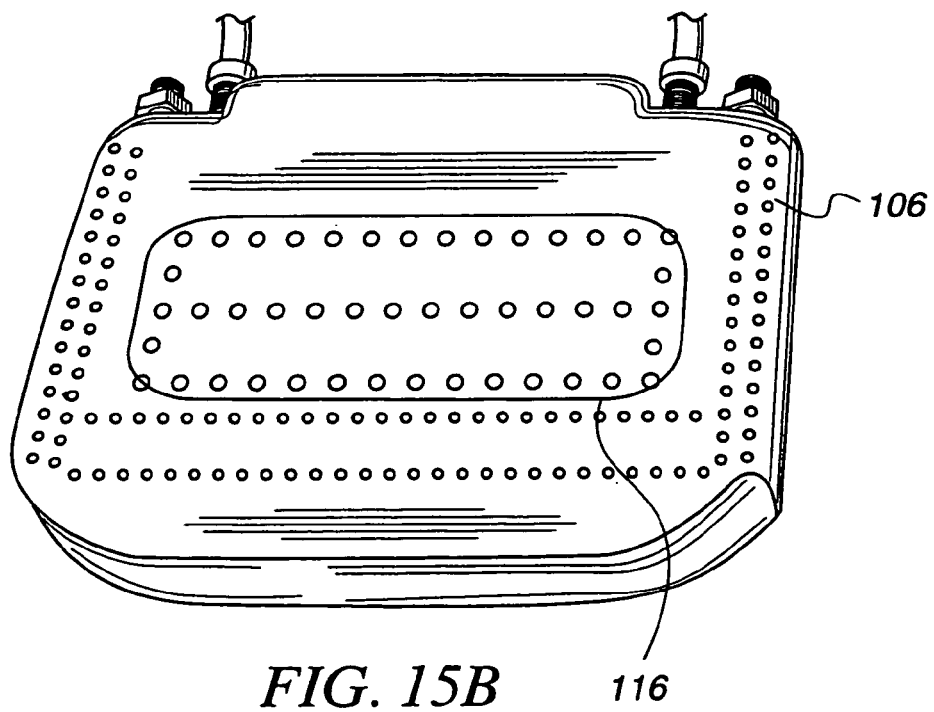
FIG. 15B illustrates the proximity head as described in FIG. 15A with IPA input in accordance with one embodiment of the present invention.

FIG. 15B illustrates the proximity head 106 as described in FIG. 15A with IPA input in accordance with one embodiment of the present invention. In this embodiment, the DIW flow rate is 500 ml/min and the IPA flow rate is 12 ml/min with the rotation of the wafer being zero. As shown by FIG. 15B, the usage of IPA flow has made the boundary of the meniscus more even. Therefore, the fluid meniscus is more stable and controllable.

Figure 15C:
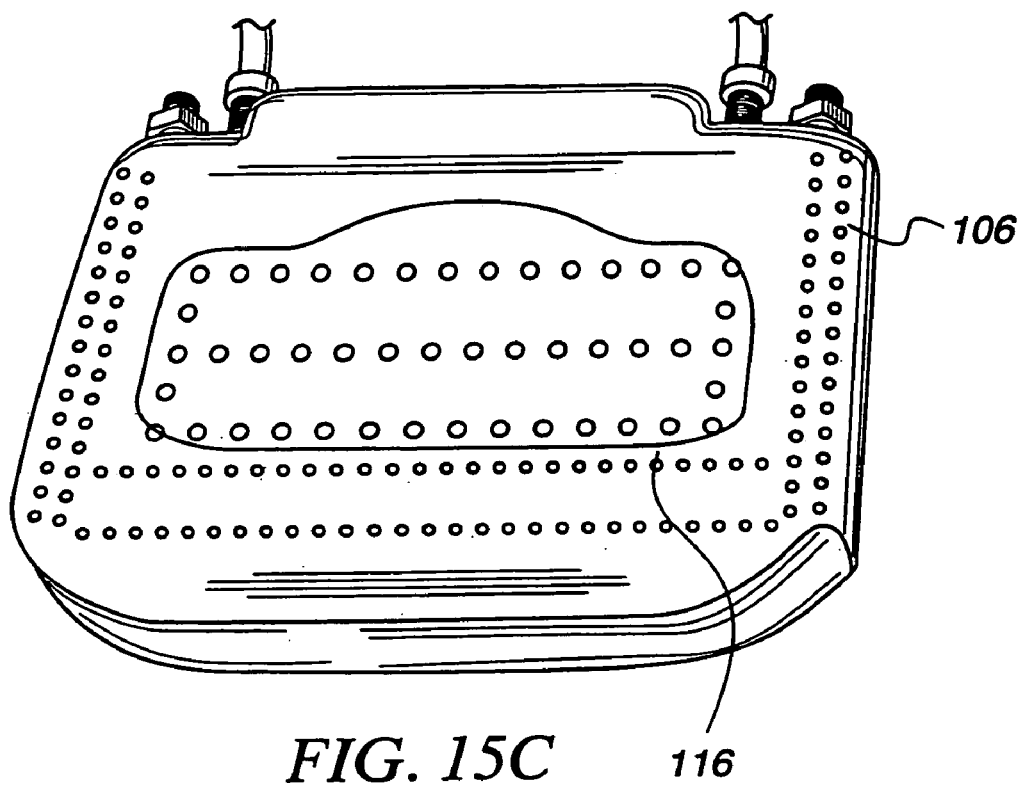
FIG. 15C shows the proximity head as described in FIG. 15B, but with the IPA flow increased to 24 SCFH in accordance with one embodiment of the present invention.

FIG. 15C shows the proximity head 106 as described in FIG. 15B, but with the IPA flow increased to 24 ml/min in accordance with one embodiment of the present invention. The rotation has been kept at zero and the flow rate of the DIW is 500 ml/min. When the IPA flow rate is too high, the fluid meniscus becomes deformed and less controllable.

Figure 15D:
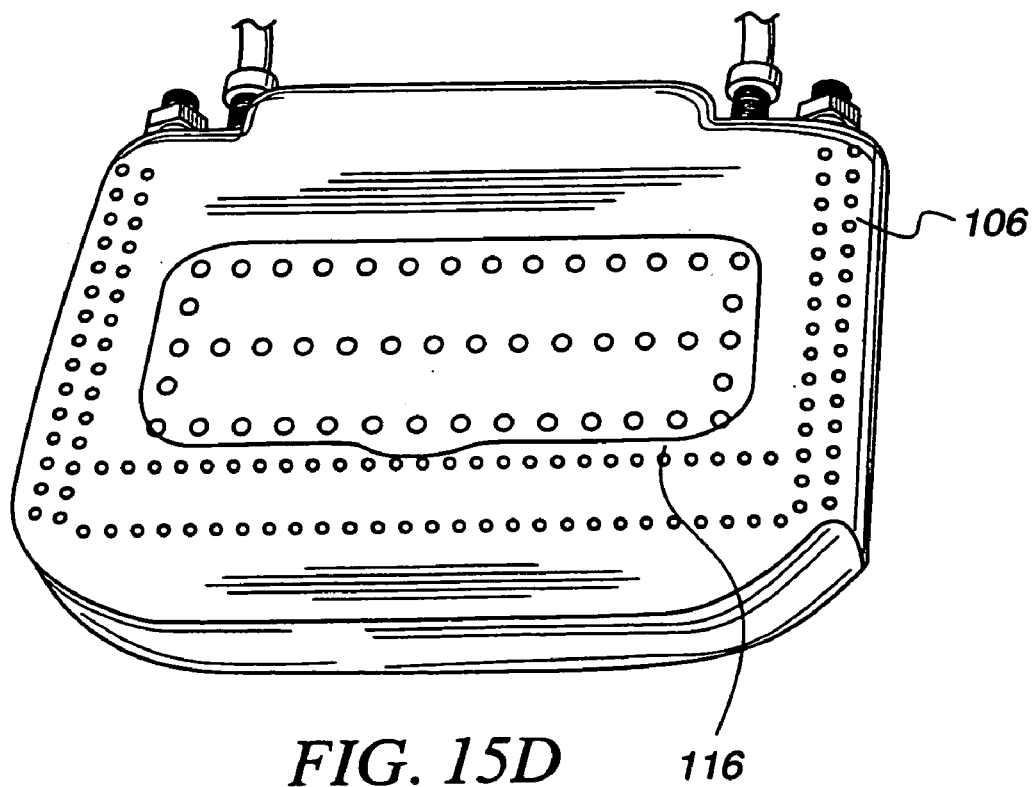
FIG. 15D shows the proximity head where the fluid meniscus is shown where the wafer is being rotated in accordance with one embodiment of the present invention.

FIG. 15D shows the proximity head 106 where the fluid meniscus is shown where the wafer is being rotated in accordance with one embodiment of the present invention. In this embodiment, the rotation of the wafer is 10 rotations per minute. The flow rate of the DIW is 500 ml/min while the flow rate of the IPA is 12 SCFH. The magnitude of the vacuum is about 30 in Hg @ 80 PSIG. When the wafer is rotated, the fluid meniscus becomes less stable due to the added wafer dynamics as compared with FIG. 15C which shows the same DIW and IPA flow rate but without wafer rotation.

Figure 15E:
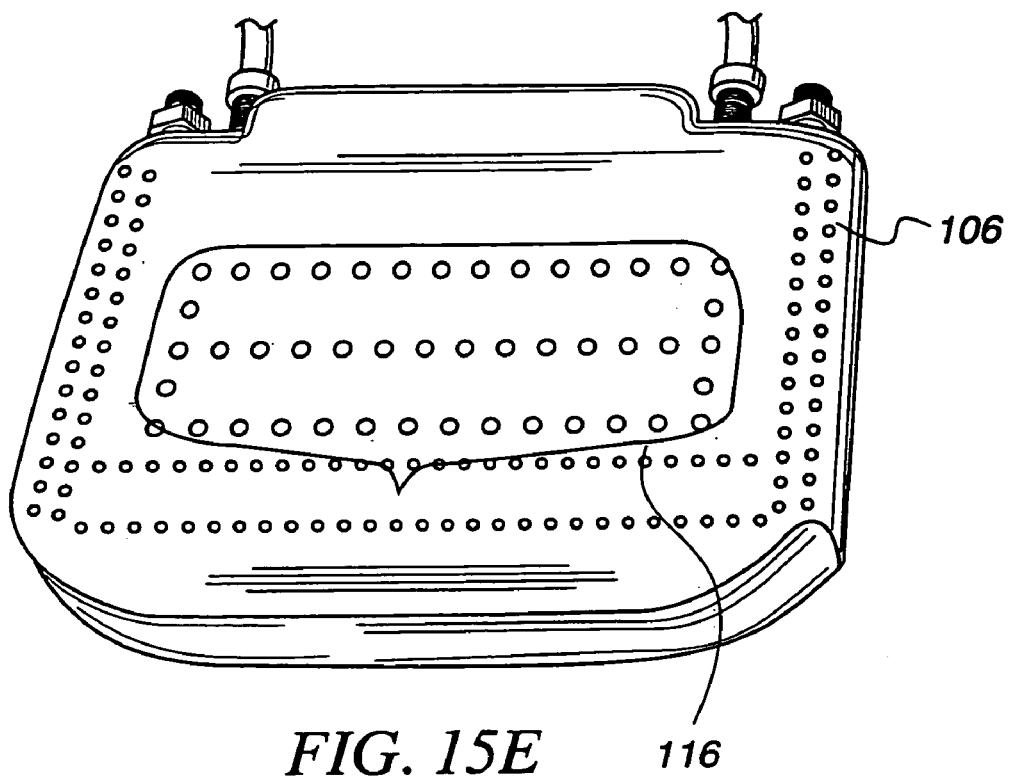
FIG. 15E shows the proximity head where the fluid meniscus is shown where the wafer is being rotated faster than the rotation shown in FIG. 15D in accordance with one embodiment of the present invention.

FIG. 15E shows the proximity head 106 where the fluid meniscus is shown where the wafer is being rotated faster than the rotation shown in FIG. 15D in accordance with one embodiment of the present invention. In this embodiment, the rotation of the wafer is 15 rotations per minute. The flow rate of the DIW is 500 ml/min while the flow rate of the IPA is 12 SCFH. The magnitude of the vacuum is about 30 on Hg @ 80 PSIG. When the wafer is rotated faster, the fluid meniscus has a more uneven boundary as compared to the fluid meniscus discussed in reference to FIG. 15D due to the added wafer dynamics as compared.

Figure 15F:
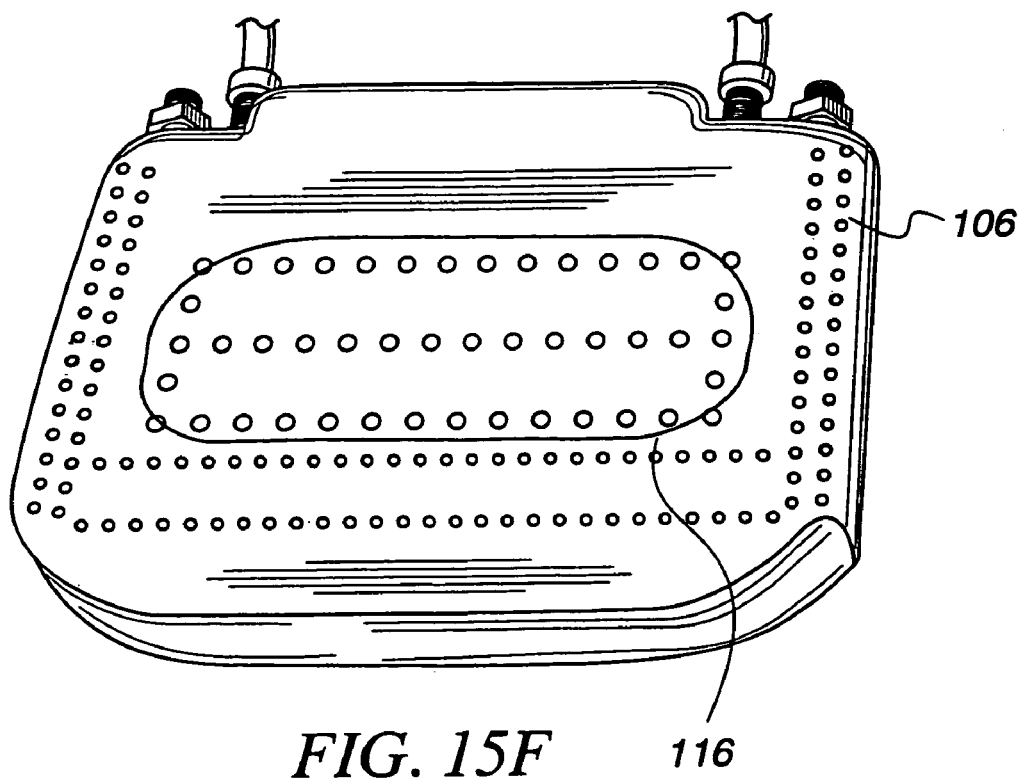
FIG. 15F shows the proximity head where the IPA flow has been increased as compared to the IPA flow of FIG. 15D in accordance with one embodiment of the present invention.

FIG. 15F shows the proximity head 106 where the IPA flow has been increased as compared to the IPA flow of FIG. 15D in accordance with one embodiment of the present invention. In this embodiment, the variables such as the DIW flow rate, rate of wafer rotation, and vacuum magnitude are the same as that described in reference to FIG. 15D. In this embodiment, the IPA flow rate was increased to 24 SCFH. With the IPA flow rate increased, the IPA holds the fluid meniscus along the border to generate a highly controllable and manageable fluid meniscus. Therefore, even with wafer rotation, the fluid meniscus looks stable with a consistent border that substantially corresponds to the region with the plurality of source inlets 302 and the region with the plurality of source outlets 304. Therefore, a stable and highly controllable, manageable, and maneuverable fluid meniscus is formed inside of the process window so, in an exemplary drying process, fluid that the proximity head 106 may encounter on a wafer surface is removed thereby quickly and efficiently drying the wafer surface.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A substrate preparation system, comprising:
a head having a head surface, the head surface configured to be proximate to a surface of the substrate when in operation;
a first conduit for delivering a first fluid to the surface of the substrate through the head;
a plurality of second conduits for removing the first fluid from the surface of the substrate, the plurality of second conduits being located to at least partially surround the first conduit, wherein the first conduit and the plurality of second conduits being configured to act substantially simultaneously when in operation so as to define a meniscus contained between the head surface and the surface of the substrate;
wherein the head extends in size up to at least a width of the substrate and the head surface includes substantially flat surface regions and discrete holes for defining the first conduit and plurality of second conduits, the discrete holes extending through the head surface.

2. A substrate preparation system as recited in claim 1, wherein the substrate moves along a specified motion profile so that the head traverses the surface of the substrate.

3. A substrate preparation system as recited in claim 1, wherein the head moves along a specified profile to traverse the surface of the substrate.

4. A substrate preparation system as recited in claim 1, wherein the first conduit is a first source inlet, and the second conduit is a source outlet.

5. A substrate preparation system as recited in claim 1, wherein a second head is positioned on an opposite side of the head and made to be proximate to an undersurface of the substrate when in operation.

6. A substrate preparation system as recited in claim 5, wherein the first and second head move synchronously to traverse over the surface of the substrate and the underside of the substrate.

7. A substrate preparation system as recited in claim 1, wherein the first fluid is one of deionized water (DIW) and a cleaning fluid.

8. A substrate preparation system as recited in claim 1, further comprising a third plurality of conduits for delivering a second fluid that is one of isopropyl alcohol (IPA) vapor, nitrogen, organic compounds, hexanol, ethyl glycol, and compounds miscible with water.

9. A substrate preparation system as recited in claim 8, further comprising:
at least one of a fourth conduit for delivering a fluid to the surface of the substrate through the head, the fluid being different than the first fluid and the second fluid.

10. A substrate preparation system as recited in claim 8, wherein the substrate rotates as the head scans over the surface of the substrate.

11. A substrate preparation system, comprising:
a head having a head surface, the head surface configured to be proximate to a surface of the substrate when in operation;
a plurality of first conduits for delivering a first fluid to the surface of the substrate through the head;
a plurality of second conduits for removing the first fluid from the surface of the substrate, the plurality of second conduits being located to at least partially surround outer regions of the plurality of first conduits, wherein the plurality of first conduits and the plurality of second conduits being configured to act substantially simultaneously when in operation so as to define a meniscus;
wherein the head extends inside up to at least a width of the substrate and the head surface includes substantially flat surface regions and discrete holes for defining the first and second plurality of conduits, the discrete holes extending through the head surface.

12. A substrate preparation system as recited in claim 11, further comprising a third plurality of conduits for delivering a second fluid that is one of isopropyl alcohol (IPA) vapor, nitrogen, organic compounds, hexanol, ethyl glycol, and compounds miscible with water.

13. A substrate preparation system as recited in claim 12, further comprising:
at least one of a fourth conduit for delivering a fluid to the surface of the substrate through the head, the, fluid being different than the first fluid and the second fluid.

14. A substrate preparation system as recited in claim 11, wherein a second head is positioned on an opposite side of the head and made to be proximate to an undersurface of the substrate when in operation.

* * * * *